US011121120B2

(12) United States Patent
Odnoblyudov et al.

(10) Patent No.: US 11,121,120 B2
(45) Date of Patent: Sep. 14, 2021

(54) METHOD AND SYSTEM FOR ELECTRONIC DEVICES WITH POLYCRYSTALLINE SUBSTRATE STRUCTURE INTERPOSER

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US)

(73) Assignee: QROMIS, INC., Santa Clara, CA (US)

( * ) Notice: Subject to any disclaimer, the term of this patent is extended or adjusted under 35 U.S.C. 154(b) by 0 days.

(21) Appl. No.: 16/217,564

(22) Filed: Dec. 12, 2018

(65) Prior Publication Data
US 2019/0181121 A1 Jun. 13, 2019

Related U.S. Application Data

(60) Provisional application No. 62/598,355, filed on Dec. 13, 2017.

(51) Int. Cl.
H01L 23/373 (2006.01)
H01L 25/065 (2006.01)
H01L 23/498 (2006.01)
H01L 25/00 (2006.01)
H01L 21/48 (2006.01)
H01L 23/538 (2006.01)
(Continued)

(52) U.S. Cl.
CPC ........ H01L 25/0657 (2013.01); H01L 21/486 (2013.01); H01L 23/3735 (2013.01); H01L 23/49827 (2013.01); H01L 23/49894 (2013.01); H01L 23/5384 (2013.01); H01L 25/50 (2013.01); H01L 23/15 (2013.01); H01L 24/13 (2013.01); H01L 24/16 (2013.01); H01L 2224/0401 (2013.01); H01L 2224/131 (2013.01); H01L 2224/13009 (2013.01); H01L 2224/16235 (2013.01); H01L 2224/81191 (2013.01); H01L 2225/06517 (2013.01); H01L 2225/06541 (2013.01); H01L 2225/06548 (2013.01); H01L 2225/06572 (2013.01); H01L 2225/06589 (2013.01); H01L 2924/10253 (2013.01); H01L 2924/14 (2013.01); H01L 2924/141 (2013.01); H01L 2924/143 (2013.01); H01L 2924/1434 (2013.01)

(58) Field of Classification Search
CPC ............. H01L 23/3731; H01L 23/3738; H01L 23/481; H01L 23/49827
See application file for complete search history.

(56) References Cited

U.S. PATENT DOCUMENTS

2011/0147772 A1* 6/2011 Lochtefeld ........ H01L 21/02458
257/94
2012/0048604 A1* 3/2012 Cornejo ............... H05K 1/0306
174/258

(Continued)

Primary Examiner — Jae Lee
(74) Attorney, Agent, or Firm — Kilpatrick Townsend & Stockton LLP

(57) ABSTRACT

An interposer includes a polycrystalline ceramic core disposed between a first surface and a second surface of the interposer, an adhesion layer encapsulating the polycrystalline ceramic core, a barrier layer encapsulating the adhesion layer, and one or more electrically conductive vias extending from the first surface to the second surface through the polycrystalline ceramic core, the adhesion layer, and the barrier layer.

21 Claims, 18 Drawing Sheets

(51) Int. Cl.
*H01L 23/15* (2006.01)
*H01L 23/00* (2006.01)

(56) References Cited

U.S. PATENT DOCUMENTS

| | | | |
|---|---|---|---|
| 2013/0307155 A1* | 11/2013 | Mitsuhashi | H01L 23/49827 257/761 |
| 2015/0376068 A1* | 12/2015 | Shannigrahi | C04B 35/495 359/245 |
| 2016/0262271 A1* | 9/2016 | Nazarenko | H05K 3/0029 |
| 2020/0168708 A1* | 5/2020 | Radosavljevic | H01L 21/0254 |

* cited by examiner

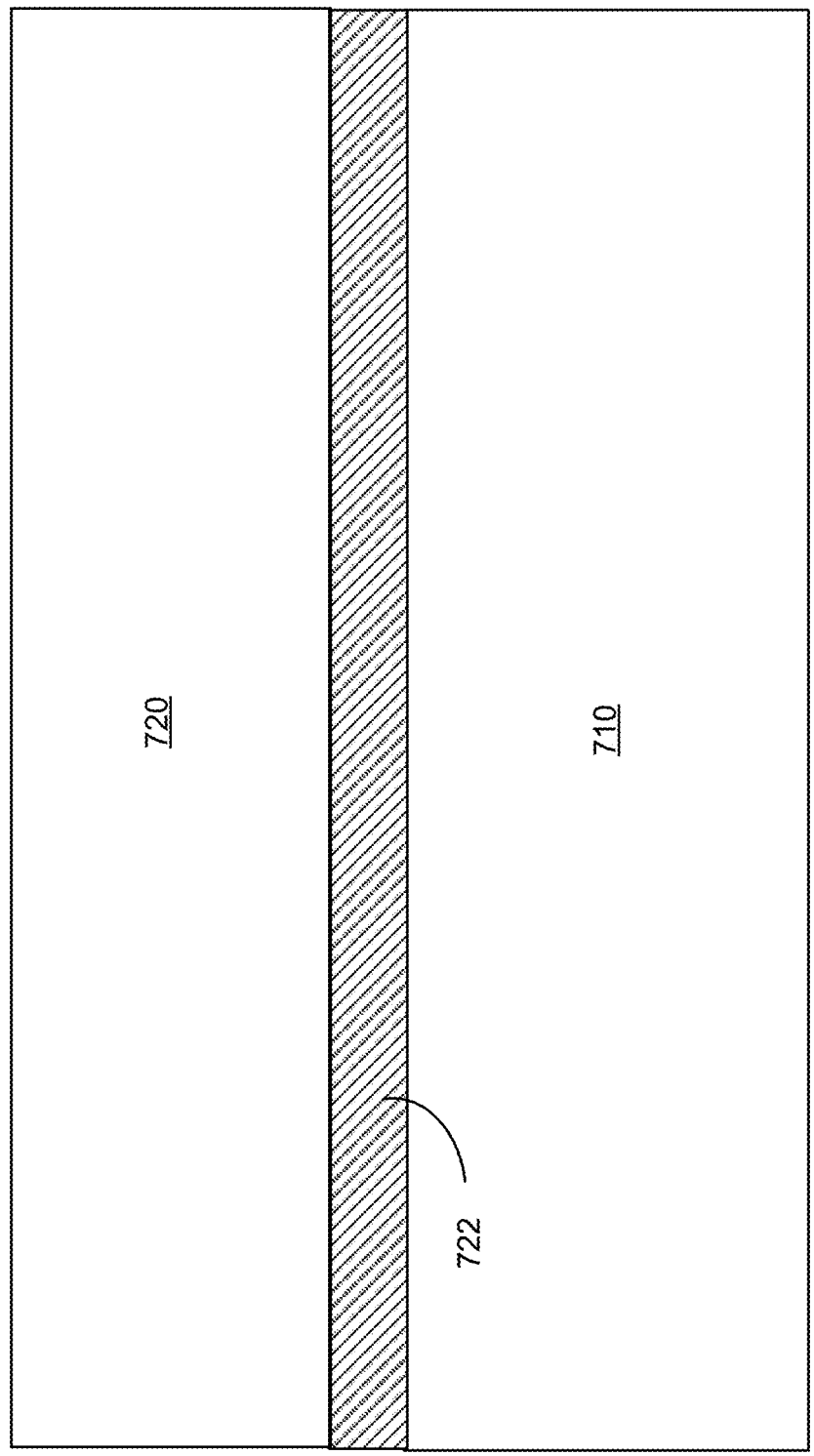

METHOD AND SYSTEM FOR ELECTRONIC DEVICES WITH POLYCRYSTALLINE SUBSTRATE STRUCTURE INTERPOSER

CROSS-REFERENCES TO RELATED APPLICATIONS

This application claims priority to U.S. Provisional Patent Application No. 62/598,355, filed on Dec. 13, 2017, the disclosure of which is hereby incorporated by reference in its entirety for all purposes.

BACKGROUND OF THE INVENTION

Heteroepitaxy of gallium nitride based compound semiconductors on sapphire, silicon carbide and silicon is currently used to fabricate devices such as light-emitting diodes (LEDs), high power devices, and high speed radio frequency (RF) devices. Applications include lighting, computer monitors, displays, wide band gap communications, automotive, and industrial power sources. The growth of gallium nitride based devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures used to fabricate devices.

SUMMARY OF THE INVENTION

The present invention relates generally to fabricating an integrated circuit comprising a system of stacked devices using an engineered substrate structure as an interposer. More specifically, the present invention relates to methods and systems suitable for fabricating integrated semiconductor devices using a dielectric coated polycrystalline interposer characterized by a coefficient of thermal expansion (CTE) that is substantially matched to the CTE of devices bonded to the interposer. As described herein, embodiments of the present invention have been applied to methods and systems for integrating different types of GaN devices on an engineered substrate structure used as an interposer to reduce interconnect lengths, reduce package form factor, reduce overall power consumption, and increase interconnect bandwidth.

According to some embodiments, an interposer includes a polycrystalline ceramic core disposed between a first surface and a second surface of the interposer, an adhesion layer encapsulating the polycrystalline ceramic core, a barrier layer encapsulating the adhesion layer, and one or more electrically conductive vias extending from the first surface to the second surface through the polycrystalline ceramic core, the adhesion layer, and the barrier layer. The barrier layer may surround side walls of the one or more electrically conductive vias. In some embodiments, the polycrystalline ceramic core may include polycrystalline aluminum nitride. The adhesion layer may include tetraethyl orthosilicate. In some embodiments, the interposer may further include one or more lateral conductive interconnects. The one or more lateral conductive interconnects may include polysilicon. In some embodiments, the interposer may further include a second adhesion layer encapsulating the one or more lateral conductive interconnects. The second adhesion layer comprises tetraethyl orthosilicate. In some embodiments, the barrier layer may include silicon nitride. In some embodiments, the one or more electrically conductive vias may have a diameter of about 10-100 μm. The one or more electrically conductive vias may include a metallic material.

According to some embodiments, a system include a first substrate. The first substrate include a first solder bump and a first semiconductor device in electrical contact with the first solder bump. The system further includes a second substrate. The second substrate includes a second solder bump and a second semiconductor device in electrical contact with the second solder bump. The system further includes an interposer. The interposer includes a first surface, a second surface disposed opposite to the first surface, a polycrystalline ceramic core disposed between the first surface and the second surface, an adhesion layer encapsulating the polycrystalline ceramic core, a barrier layer encapsulating the adhesion layer, and one or more electrically conductive vias extending from the first surface to the second surface through the polycrystalline ceramic core, the adhesion layer, and the barrier layer. Each of the one or more electrically conductive vias includes a first bonding pad on the first surface and a second bonding pad on the second surface. The first solder bump is coupled to the first bonding pad on the first surface, and the second solder bump is coupled to the second bonding pad on the second surface. In some embodiments, the first semiconductor device is in electrical contact with the second semiconductor device through a subset of the one or more electrically conductive vias. The first substrate may be coupled to the interposer by the first solder bump. In some embodiments, The system further includes a dielectric coating coupled to the second substrate, wherein the dielectric coating is coupled to the barrier layer of the interposer. In some embodiments, the system further includes a silicon layer coupled to the dielectric coating and the barrier layer of the interposer.

According to some embodiments, a method includes forming an interposer including a first surface and a second surface by: providing a polycrystalline ceramic core disposed between the first surface and the second surface, removing material from a portion of the polycrystalline ceramic core to form one or more channels extending from the first surface to the second surface, encapsulating the polycrystalline ceramic core in an adhesion layer, and encapsulating the adhesion layer in a barrier layer. The barrier layer covers side walls of the one or more channels. The method further includes depositing a conductive material in the one or more channels to form one or more vias. In some embodiments, the polycrystalline ceramic core may include polycrystalline aluminum nitride. The adhesion layer may include tetraethyl orthosilicate. In some embodiments, the method may further include providing a first substrate and a second substrate. The first substrate includes a first solder bump and a first plurality of devices in electrical contact with the first solder bump. The second substrate includes a second solder bump and a second plurality of devices in electrical contact with the second solder bump. The method may further includes forming a first electrical contact between a first via of the one or more vias and the first solder bump at the first surface of the interposer, and forming a second electrical contact between a second via of the one or more vias and the second solder bump at the second surface of the interposer.

BRIEF DESCRIPTION OF THE DRAWINGS

FIG. 7 is a simplified schematic diagram illustrating a device carrying substrate bonded to an engineered substrate structure according to an embodiment of the present invention.

DETAILED DESCRIPTION OF SPECIFIC EMBODIMENTS

The present invention relates generally to fabricating an integrated circuit comprising a system of stacked devices using an engineered substrate structure as an interposer. In some embodiments, the engineered substrate structure can be a polycrystalline interposer characterized by a coefficient of thermal expansion (CTE) that is substantially matched to the CTE of devices bonded to the interposer. The use of an interposer versus monolithically integrated devices can reduce the interconnect length, form factor, and overall cost of an integrated circuit. In some embodiments, the reduced interconnect length can result in reduced power consumption and increased bandwidth between the devices. A polycrystalline interposer can be a passive layer. In some embodiments, a polycrystalline interposer with a CTE substantially matched to substrates and devices bonded thereon improves thermal management and stress when compared to existing technologies. Embodiments described herein use an engineered substrate structure with a polycrystalline ceramic core as in interposer.

Figure 1:
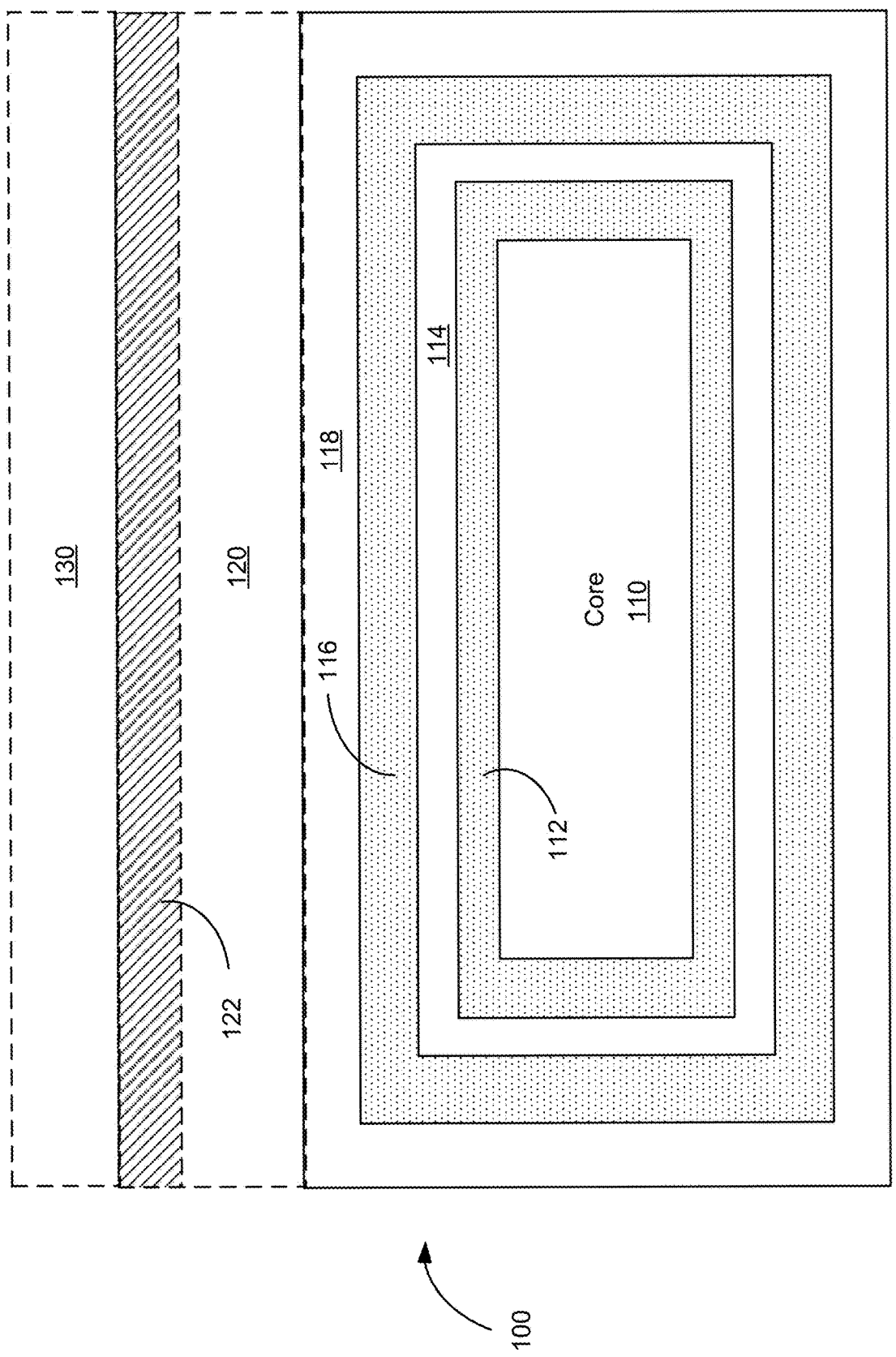
FIG. 1 is a simplified schematic cross-sectional diagram illustrating an engineered substrate structure according to an embodiment of the present invention.

FIG. 1 is a simplified schematic cross-sectional diagram illustrating an engineered substrate structure according to an embodiment of the present invention. The engineered substrate 100 illustrated in FIG. 1 is suitable for a variety of electronic and optical applications. The engineered substrate 100 includes a core 110 that can have a coefficient of thermal expansion (CTE) that is substantially matched to the CTE of the epitaxial material 130 that can be grown on the engineered substrate 100. Epitaxial material 130 is illustrated as optional because it is not required as an element of the engineered substrate 100.

For applications including gallium nitride (GaN)-based devices (epitaxial layers including GaN-based layers), the core 110 can be a polycrystalline ceramic material such as polycrystalline aluminum nitride (AlN), which can include a binding material such as yttrium oxide. Other materials can be utilized in the core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide (Ga$_2$O$_3$), boron nitride (BN), aluminum oxide (Al$_2$O$_3$), and the like. In some embodiments, the core 110 can be comprised of a plurality of polycrystalline materials.

The thickness of the core can be on the order of 100 μm to 1,500 μm, for example, 725 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, SiO$_2$ or other silicon oxides (Si$_x$O$_y$) adhere well to ceramic materials and provide a suitable surface for subsequent deposition, for example, of conductive materials. In some embodiments, the adhesion layer 112 completely surrounds the core 110 to form a fully encapsulated core. The adhesion layer 112 can be formed using a low pressure chemical-vapor deposition (LPCVD) process. The adhesion layer provides a surface on which subsequent layers adhere to form elements of the engineered substrate 100 structure.

In addition to the use of LPCVD processes, furnace-based processes, and the like to form the encapsulating first adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

Optionally, a conductive layer 114 can be formed surrounding the adhesion layer 112. In an embodiment, the conductive layer 114 is a shell of polysilicon (i.e., polycrystalline silicon) that is formed surrounding the first adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the first adhesion layer 112 (e.g., a TEOS oxide layer), thereby forming a fully encapsulated first adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure. In other embodiments, the conductive layer 114 can be selectively etched to form one or more lateral conductive interconnects to connect devices bonded to the same surface of the engineered substrate.

In an embodiment, the conductive layer 114 can be a polysilicon layer doped to provide a highly conductive material, for example, doped with boron to provide a P-type polysilicon layer. In some embodiments, the doping with boron is at a level of $1\times10^{19}$ cm$^{-3}$ to $1\times10^{20}$ cm$^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) can be utilized to provide either N-type or P-type semiconductor materials suitable for use in the conductive layer 114. One of ordinary skill in the art would recognize many variations, modifications, and alternatives.

The presence of the conductive layer 114 is useful during electrostatic chucking of the engineered substrate 100 to semiconductor processing tools, for example tools with electrostatic discharge (ESD) chucks. The conductive layer 114 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

Optionally, a second adhesion layer 116 (e.g., a TEOS oxide layer on the order of 1,000 Å in thickness) can be formed surrounding the conductive layer 114. In some embodiments, the second adhesion layer 116 completely surrounds the conductive layer 114 to form a fully encapsulated structure. The second adhesion layer 116 can be formed using an LPCVD process, a CVD process, or any other suitable deposition process, including the deposition of a spin-on dielectric. In cases where the conductive layer 114 is not included, the second adhesion layer 116 may be omitted.

A barrier layer 118, for example, a silicon nitride layer, is formed surrounding the second adhesion layer 116. In an embodiment, the barrier layer 118 is a silicon nitride layer that is on the order of 4,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer, e.g., a silicon nitride layer, prevents diffusion and/or outgassing of elements present in the core 110 into the environment of the semiconductor processing chambers in which the engineered substrate 100 could be present, for example, during a high temperature (e.g., 1,000° C.) epitaxial growth process. Elements present in the core 110 can include, for example, yttrium oxide (i.e., yttria), oxygen, metallic impurities, other trace elements, and the like. The elements diffused from the core 110 can cause unintentional doping in engineered layers 120/122. The elements outgassed from the core 110 can travel through the chamber and adsorb elsewhere on the wafer causing impurities in engineered layers 120/122 and epitaxial material 130. Utilizing the encapsulating layers described herein, ceramic materials, including polycrystalline AlN that are designed for non-clean room environments, can be utilized in semiconductor process flows and clean room environments.

Figure 2A:
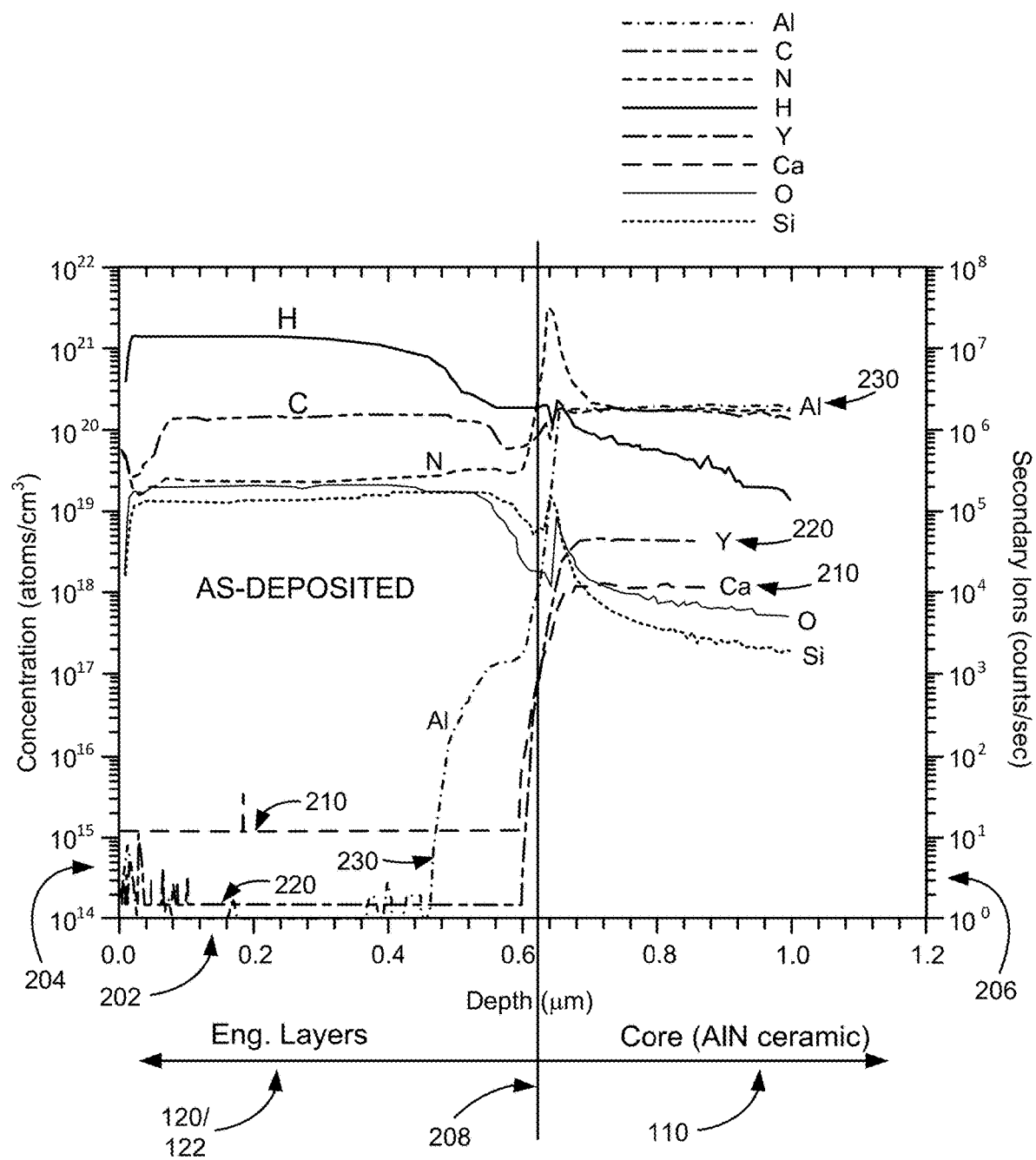
FIG. 2A is a SIMS profile illustrating species concentration as a function of depth for an engineered structure according to an embodiment of the present invention.

FIG. 2A is a secondary ion mass spectroscopy (SIMS) profile illustrating species concentration as a function of depth for an engineered structure according to an embodiment of the present invention. The x-axis represents the depth 202 from the surface of the engineered layers 120/122 to the core 110. Line 208 represents the interface between the engineered layers 120/122 and the core 110. A first y-axis 204 represents the species concentration of atoms per cubic centimeter. A second y-axis 206 represents the signal intensity of the ions in counts per second. The engineered structure in FIG. 2A did not include barrier layer 118. Referring to FIG. 2A, several species present in the ceramic core 110 (e.g., yttrium, calcium, and aluminum) drop to negligible concentrations in the engineered layers 120/122. The concentrations of calcium 210, yttrium 220, and aluminum 230 drop by three, four, and six orders of magnitude, respectively.

Figure 2B:
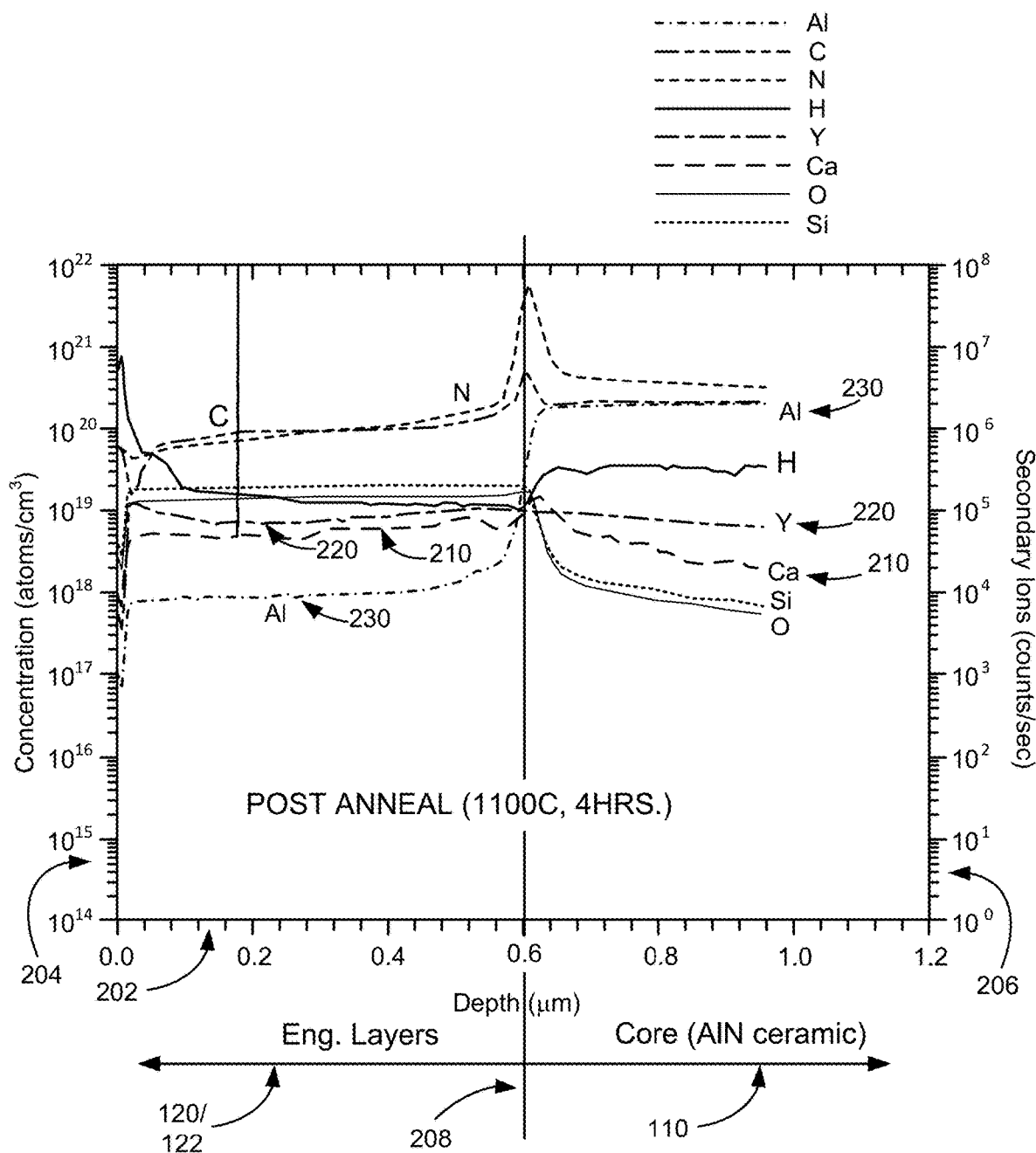
FIG. 2B is a SIMS profile illustrating species concentration as a function of depth for an engineered structure after high-temperature annealing according to an embodiment of the present invention.

FIG. 2B is a SIMS profile illustrating species concentration as a function of depth for an engineered structure without a barrier layer after high-temperature annealing according to an embodiment of the present invention. As discussed above, during semiconductor processing operations, the engineered substrate structures provided by embodiments of the present invention can be exposed to high temperatures (~1,100° C.) for several hours, for example, during epitaxial growth of GaN-based layers. For the profile illustrated in FIG. 2B, the engineered substrate structure was annealed at 1,100° C. for a period of four hours. As shown by FIG. 2B, calcium 210, yttrium 220, and aluminum 230, originally present in low concentrations in the engineered layers 120/122, have diffused into the engineered layers 120/122, reaching concentrations similar to other elements.

Accordingly, embodiments of the present invention integrate a barrier layer (e.g., a silicon nitride layer) to prevent out-diffusion of the background elements from the polycrystalline ceramic material (e.g., AlN) into the engineered layers 120/122 and epitaxial material 130 such as the optional GaN layer. The silicon nitride layer encapsulating the underlying layers and material provides the desired barrier layer 118 functionality.

Figure 2C:
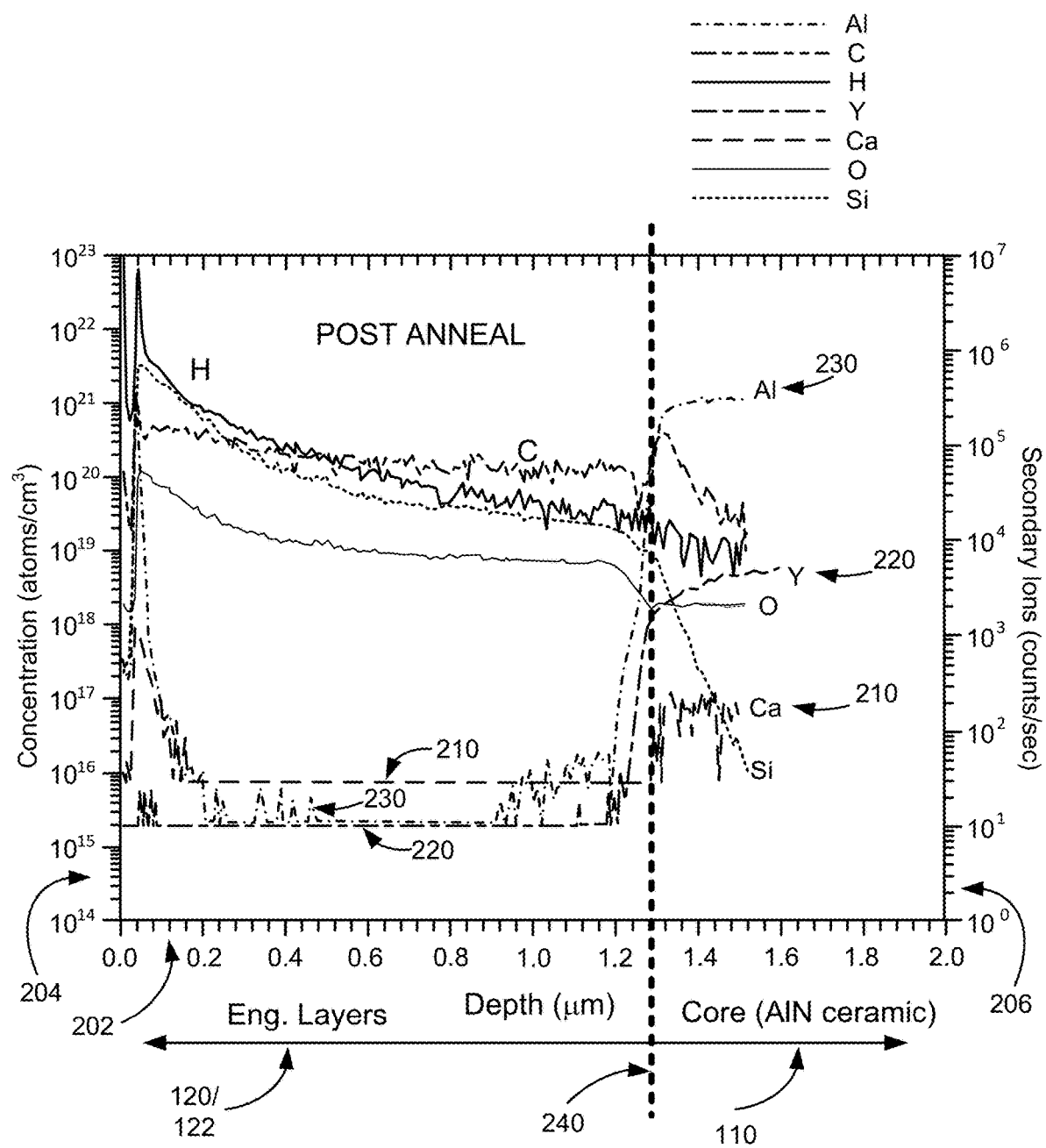
FIG. 2C is a SIMS profile illustrating species concentration as a function of depth for an engineered structure with a silicon nitride layer after high-temperature annealing according to an embodiment of the present invention.

FIG. 2C is a SIMS profile illustrating species concentration as a function of depth for an engineered structure with a barrier layer 118, represented by dashed-line 240, after high-temperature annealing according to an embodiment of the present invention. The integration of the diffusion barrier layer 118 (e.g., a silicon nitride layer) into the engineered substrate structure prevents the diffusion of calcium, yttrium, and aluminum into the engineered layers during the annealing process that occurred when the diffusion barrier layer was not present. As illustrated in FIG. 2C, calcium 210, yttrium 220, and aluminum 230 present in the ceramic core remain at low concentrations in the engineered layers post-anneal. Thus, the use of the barrier layer 118 (e.g., a silicon nitride layer) prevents these elements from diffusing through the diffusion barrier and thereby prevents their release into the environment surrounding the engineered substrate. Similarly, any other impurities contained within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate 100 to prevent this undesirable diffusion.

Referring once again to FIG. 1, optionally, a bonding layer 120 (e.g., a silicon oxide layer) is deposited on a portion of the barrier layer 118, for example, the top surface of the barrier layer, and subsequently used during the bonding of a single crystal layer 122. The bonding layer 120 can be approximately 1.5 µm in thickness in some embodiments. The single crystal layer 122 can include, for example, Si, SiC, sapphire, GaN, AlN, SiGe, Ge, Diamond, $Ga_2O_3$, AlGaN, InGaN, InN, and/or ZnO. In some embodiments, the single crystal layer can have a thickness from 0-0.5 µm. The single crystal layer 122 is suitable for use as a growth layer during an epitaxial growth process for the formation of epitaxial material 130. The crystalline layers of the epitaxial material 130 are an extension of the underlying semiconductor lattice associated with the single crystal layer 122. The unique CTE matching properties of the engineered substrate 100 enable growth of thicker epitaxial material 130 than existing technologies. In some embodiments, the epitaxial material 130 includes a gallium nitride layer, 2 µm to 10 µm in thickness, which can be utilized as one of a plurality of layers utilized in optoelectronic devices, power devices, and the like. In an embodiment, the bonding layer 120 includes a single crystal silicon layer that is attached to a silicon oxide barrier layer 118 using a layer transfer process.

Figure 3:
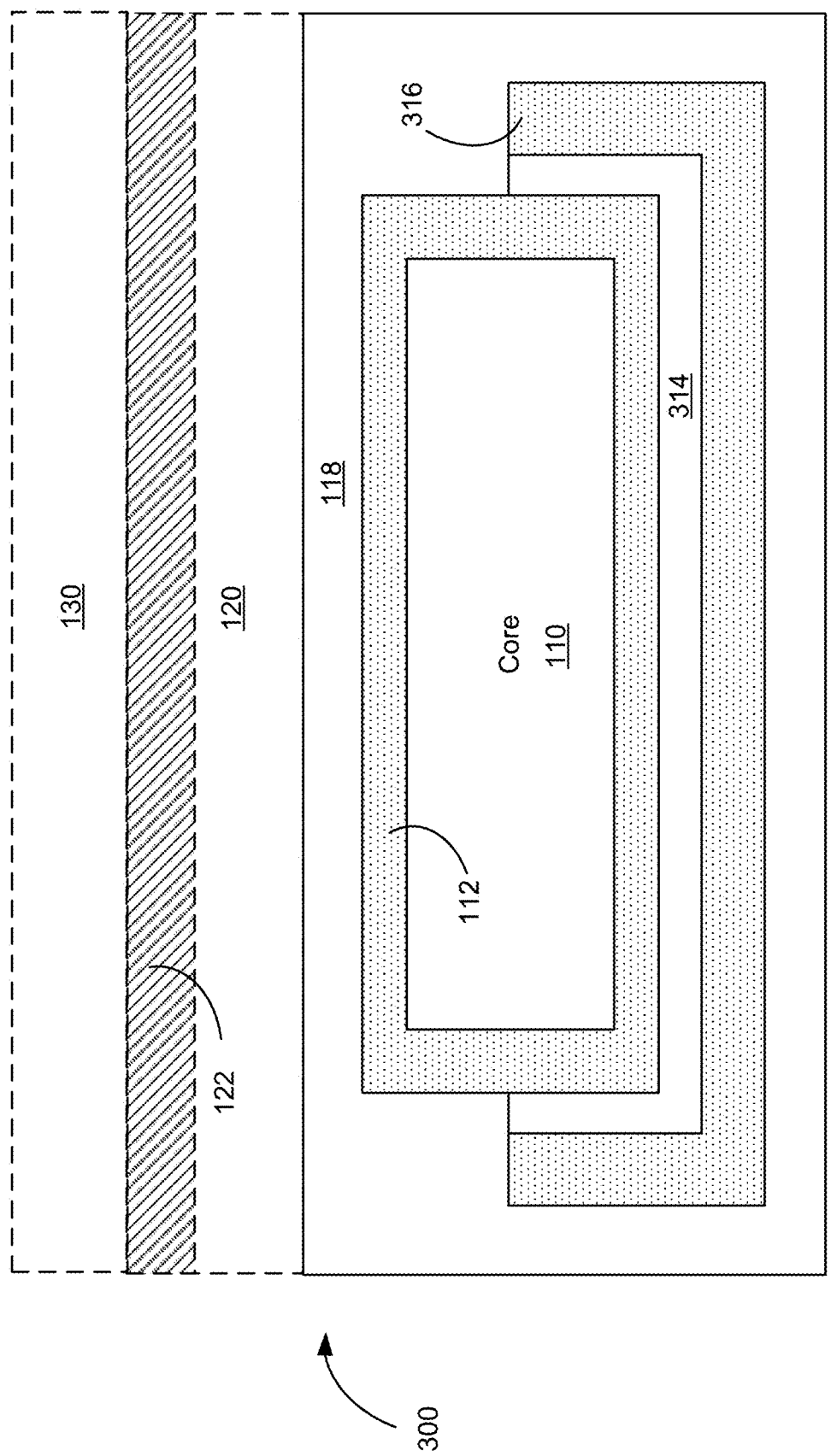
FIG. 3 is a simplified schematic diagram illustrating an engineered substrate structure according to another embodiment of the present invention.

FIG. 3 is a simplified schematic cross-sectional diagram illustrating an engineered substrate structure according to an embodiment of the present invention. The engineered substrate 300 illustrated in FIG. 3 is suitable for a variety of electronic and optical applications. The engineered substrate 300 includes a core 110 that can have a coefficient of thermal expansion (CTE) that is substantially matched to the CTE of the epitaxial material that will be grown on the engineered substrate 300. Additionally, when the engineered substrate 300 is used as an interposer, the CTE of the engineered substrate can be substantially matched to the CTE of a wafer or devices coupled to the engineered substrate. Bonding layer 120, single crystal layer 122, and epitaxial material 130 are illustrated as optional because they are not required as an element of the engineered substrate structure 300 if the engineered substrate structure is used as an interposer, but can optionally be grown on the engineered substrate structure.

For applications including the growth of gallium nitride (GaN)-based materials (epitaxial layers including GaN-based layers) or the coupling of GaN-based devices to an engineered substrate structure used as an interposer, the core 110 can be a polycrystalline ceramic material, for example, polycrystalline aluminum nitride (AlN). The thickness of the core can be on the order of 100 µm to 1,500 µm, for example, 725 µm. The core 110 is encapsulated in an adhesion layer 112 that can be referred to as a shell or an encapsulating shell. In this implementation, the adhesion layer 112 completely encapsulates the core, but this is not required by the present invention, as discussed in additional detail with respect to FIG. 4.

In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition of, for example, conductive materials. The adhesion layer 112 completely surrounds the core 110 in some embodiments to form a fully encapsulated core and can be formed using an LPCVD process. The adhesion layer 112 provides a surface on which subsequent layers adhere to form elements of the engineered substrate structure.

In addition to the use of LPCVD processes, furnace-based processes, and the like to form the encapsulating adhesion layer 112, other semiconductor processes can be utilized according to embodiments of the present invention. As an example, a deposition process, for example, CVD, PECVD, or the like, that coats a portion of the core 110 can be utilized, the core 110 can be flipped over, and the deposition process could be repeated to coat additional portions of the core 110.

Optionally, a conductive layer 314 can formed on at least a portion of the adhesion layer 112. In an embodiment, the conductive layer 314 includes polysilicon (i.e., polycrystalline silicon) that is formed by a deposition process on a lower portion (e.g., the lower half or backside) of the structure formed by the core 110 and the adhesion layer 112. In embodiments in which the conductive layer 314 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 314 can be a polysilicon layer doped to provide a highly conductive material, for example, the conductive layer 314 can be doped with boron to provide a P-type polysilicon layer. In some embodiments, the doping with boron is at a level ranging from about $1\times10^{19}$ cm$^{-3}$ to $1\times10^{20}$ cm$^{-3}$ to provide for high conductivity. The presence of the conductive layer 314 is useful during electrostatic chucking of the engineered substrate to semiconductor processing tools, for example tools with electrostatic discharge (ESD) chucks. The conductive layer 314 enables rapid dechucking after processing. Thus, embodiments of the present invention provide substrate structures that can be processed in manners utilized with conventional silicon wafers. One of ordinary skill in the art would recognize many variations, modifications, and alternatives.

Optionally, a second adhesion layer 316 (e.g., a second TEOS oxide layer) can be formed surrounding the conductive layer 314 (e.g., a polysilicon layer). The second adhesion layer 316 is on the order of 1,000 Å in thickness. The second adhesion layer 316 completely surrounds the conductive layer 114 in some embodiments to form a fully encapsulated structure and can be formed using an LPCVD process.

A barrier layer 118 (e.g., a silicon nitride layer) is formed surrounding the second adhesion layer 316. The barrier layer 118 is on the order of 4,000 Å to 5,000 Å in thickness in some embodiments. The barrier layer 118 completely surrounds the second adhesion layer 316 in some embodiments to form a fully encapsulated structure and can be formed using an LPCVD process.

In some embodiments, the use of a barrier layer 118 that includes silicon nitride prevents diffusion and/or outgassing of elements present in the core 110 into the environment of the semiconductor processing chambers in which the engineered substrate could be present, for example, during a high temperature (e.g., 1,000° C.) epitaxial growth process. Elements present in the core include, for example, yttrium oxide (i.e., yttria), oxygen, metallic impurities, other trace elements and the like. Utilizing the encapsulating layers described herein, ceramic materials, including polycrystalline AlN, that are designed for non-clean room environments can be utilized in semiconductor process flows and clean room environments.

In some embodiments, the engineered substrate 100 can be compliant with Semiconductor Equipment and Materials International (SEMI) standard specifications. Because the engineered substrate 100 can be compliant with SEMI specifications, the engineered substrate 100 can be used with existing semiconductor fabrication tools. For example, wafer diameter for the engineered substrate can be 4-inch, 6-inch, 8-inch, or 12-inch. In some embodiments, an 8-inch engineered substrate wafer can be 725-750 µm in thickness. In contrast, current silicon substrates used to manufacture gallium nitride epitaxial layers are not compliant with SEMI specifications because the silicon substrates are 1050-1500 µm in thickness. As a result of the non-compliance, silicon substrates of standard wafer diameters cannot be used in equipment that complies with SEMI specifications to grow GaN based devices.

Figure 4:
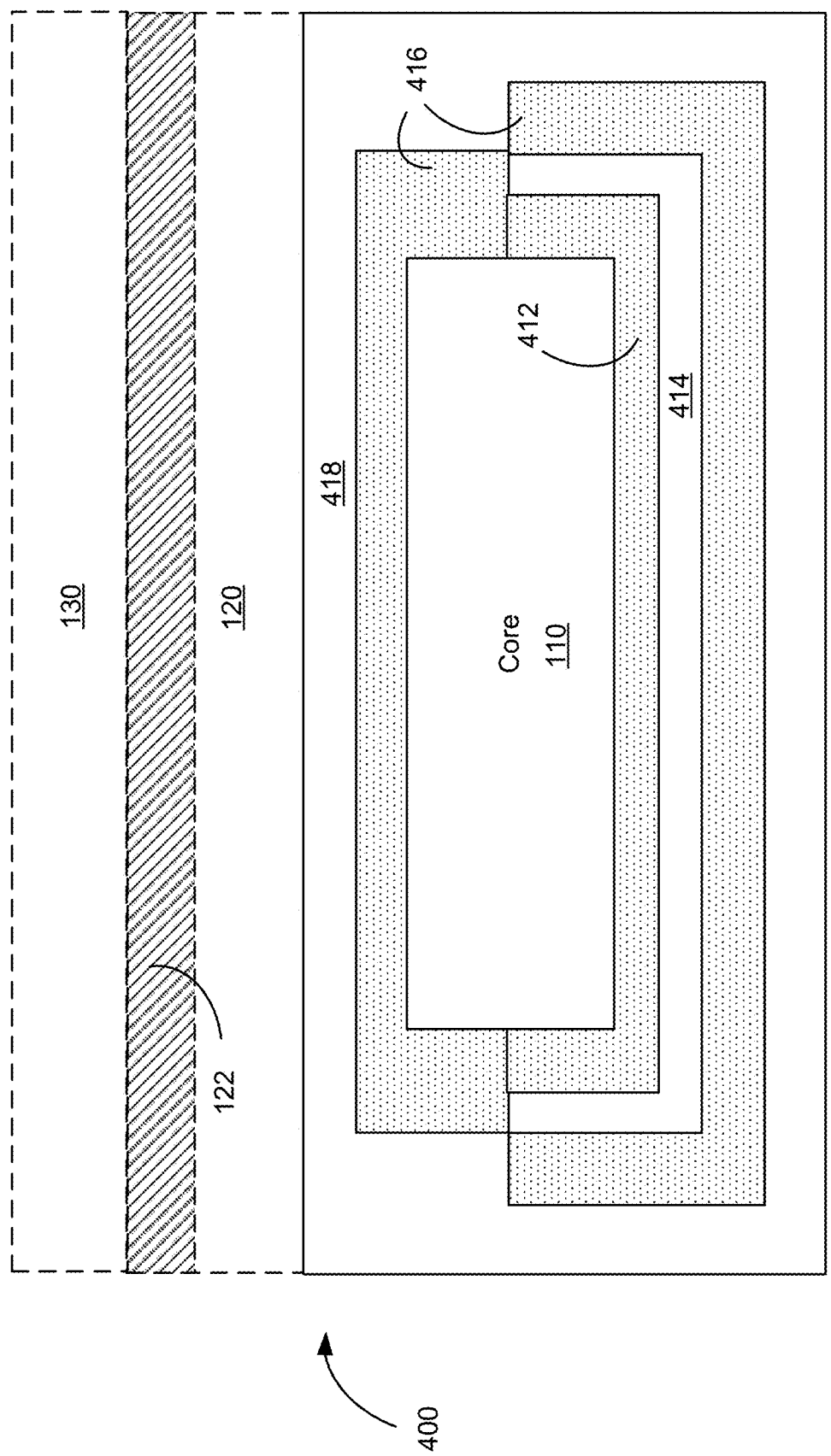
FIG. 4 is a simplified schematic diagram illustrating an engineered substrate structure according to yet another embodiment of the present invention.

FIG. 4 is a simplified schematic cross-sectional diagram illustrating an engineered substrate structure 400 according to another embodiment of the present invention. In the embodiment illustrated in FIG. 4, the adhesion layer 412 is formed on at least a portion of the core 110 but does not encapsulate the core 110. In this implementation, the adhesion layer 412 is formed on a lower surface of the core (the backside of the core) in order to enhance the adhesion of a subsequently formed conductive layer 414 as described more fully below. Although adhesion layer 412 is only illustrated on the lower surface of the core in FIG. 4, it will be appreciated that deposition of adhesion layer material on other portions of the core will not adversely affect the performance of the engineered substrates structure and such material can be present in various embodiments. One of ordinary skill in the art would recognize many variations, modifications, and alternatives.

Optionally, the conductive layer 414, rather than being formed as a shell as illustrated in FIG. 3, does not encapsulate the adhesion layer 412 and core 110, but is substantially aligned with the adhesion layer 412. Although the conductive layer 414 is illustrated as extending along the bottom or backside and up a portion of the sides of the adhesion layer 412, this is not required by the present invention. Thus, embodiments can utilize deposition on one side of the substrate structure, masking of one side of the substrate structure, or the like. The conductive layer 414 can be formed on a portion of one side, for example, the bottom/backside, of the adhesion layer 412. The conductive layer 414 provides for electrical conduction on one side of the engineered substrate structure 400, which can be advantageous in RF and high power applications. The conductive layer 414 can include doped polysilicon as discussed in relation to conductive layer 114 in FIG. 1. In addition to semiconductor-based conductive layers, in other embodiments, the conductive layer 414 is a metallic layer, for example, 500 Å of titanium, or the like. In embodiments where the engineered substrate structure is used as an interposer, the conductive layer 414 can be selectively formed to provide lateral interconnects for devices coupled to the same side of the engineered substrate.

Optionally, portions of the core 110, portions of the adhesion layer 412, and the conductive layer 414 can be covered with a second adhesion layer 416 in order to enhance the adhesion of the barrier layer 418 to the underlying materials. The barrier layer 418 forms an encapsulating structure to prevent diffusion from underlying layers as discussed above in relation to FIGS. 2A, 2B, and 2C.

Referring once again to FIG. 4, depending on the implementation, one or more layers may be removed. For example, the adhesion layer 412 and the conductive layer 414 can be removed, leaving only single adhesion shell 416 and barrier layer 418. In another embodiment, only the conductive layer 414 can be removed, leaving single adhesion layer 412 underneath the barrier layer 418. In this embodiment, adhesion layer 412 may also balance the stress and the wafer bow induced by bonding layer 120, deposited on top of barrier layer 418. The construction of a substrate structure with insulating layers on the top side of core 110 (e.g., with only insulating layer between core 110 and bonding layer 120) will provide benefits for power/RF and stacked device applications, where a highly insulating substrate is desirable.

In another embodiment, barrier layer 418 may directly encapsulate core 110, followed by conductive layer 414 and subsequent adhesion layer 416. In this embodiment, bonding layer 120 may be directly deposited onto adhesion layer 416 from the top side. In yet another embodiment, adhesion layer 416 may be deposited on core 110, followed by a barrier layer 418, and then followed by conductive layer 414, and another adhesion layer 412.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

Figure 5:
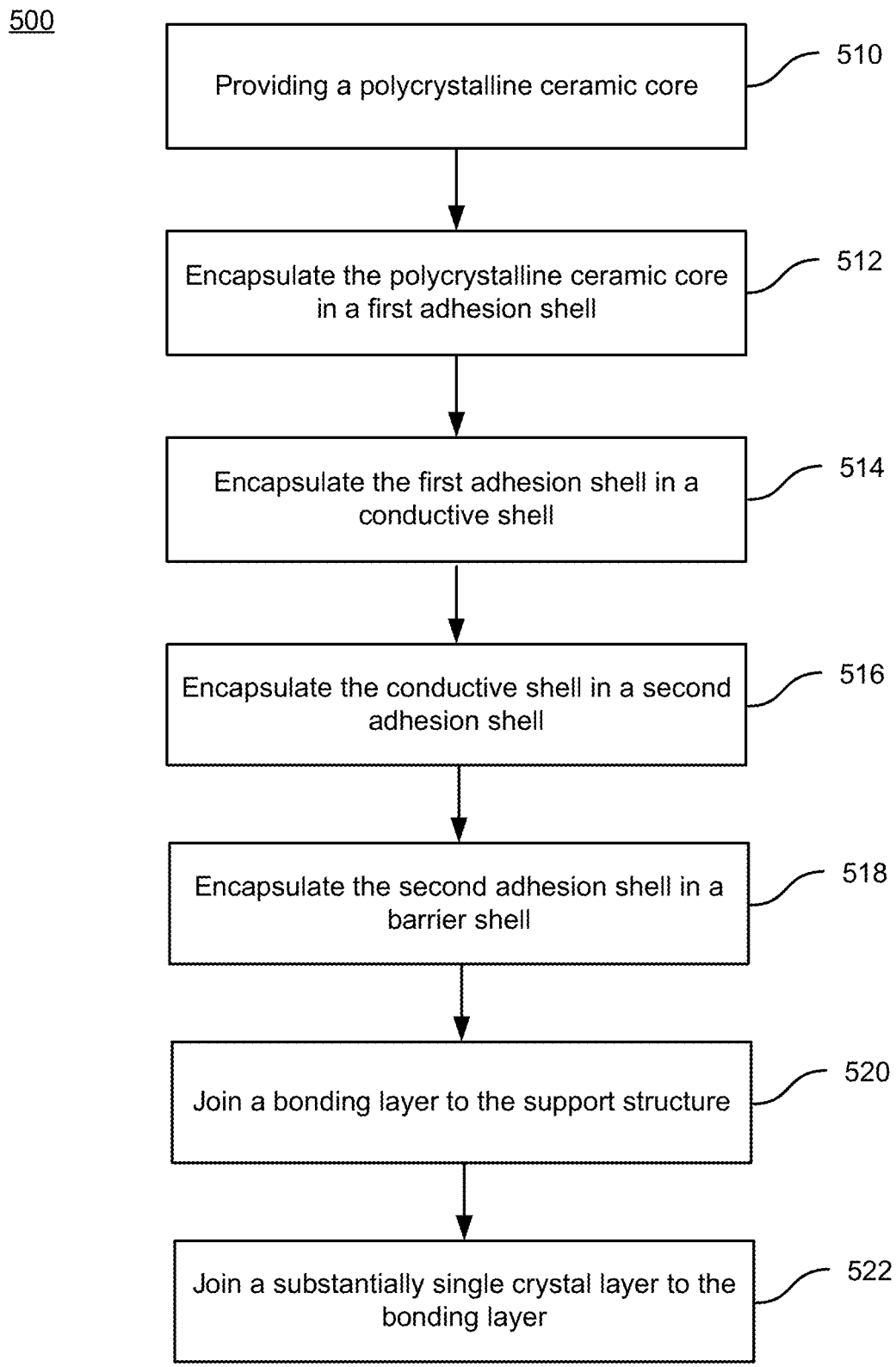
FIG. 5 is a simplified flowchart illustrating a method of fabricating an engineered substrate according to an embodiment of the present invention.

FIG. 5 is a simplified flowchart illustrating a method of fabricating an engineered substrate according to an embodiment of the present invention. The method can be utilized to manufacture a substrate that is CTE matched to one or more of the epitaxial layers grown on the substrate. The method 500 includes forming a support structure by providing a polycrystalline ceramic core (510), encapsulating the polycrystalline ceramic core in a first adhesion layer forming a shell (512) (e.g., a tetraethyl orthosilicate (TEOS) oxide shell), and, optionally, encapsulating the first adhesion layer in a conductive shell (514) (e.g., a polysilicon shell). The first adhesion layer can be formed as a single layer of TEOS oxide. The conductive shell can be formed as a single layer of polysilicon.

Optionally, the method also includes encapsulating the conductive shell in a second adhesion layer (516) (e.g., a second TEOS oxide shell). The engineered substrate can be encapsulated in a barrier layer shell (518). The second adhesion layer can be formed as a single layer of TEOS oxide. The barrier layer shell can be formed as a single layer of silicon nitride.

Once the support structure is formed by processes 510-518, the method optionally includes joining a bonding layer (e.g., a silicon oxide layer) to the support structure (520) and joining a substantially single crystal layer, for example, a single crystal silicon layer, to the silicon oxide layer (522). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 1, optionally, the bonding layer 120 can be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 1 are formed. The oxide layer also serves as a dielectric layer for the devices. The CMP process provides a substantially planar surface free of voids, particles, or other features, which can then be used during a wafer transfer process to bond the single crystal layer 122 (e.g., a single crystal silicon layer) to the bonding layer 120. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 122 (e.g., a single crystal silicon layer) to the bonding layer 120. In some embodiments, a silicon wafer including the substantially single crystal layer 122 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 122 can be varied to meet the specifications of various applications. Moreover, the crystal orientation of the single crystal layer 122 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 122. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 122 can be thick enough to provide a high quality lattice template for the subsequent growth of one or more epitaxial layers but thin enough to be highly compliant. The single crystal layer 122 may be said to be "compliant" when the single crystal layer 122 is relatively thin such that its physical properties are less constrained and able to mimic those of the materials surrounding it with less propensity to generate crystalline defects (e.g., dislocations). The compliance of the single crystal layer 122 may be inversely related to the thickness of the single crystal layer 122. A higher compliance can result in lower defect densities in the epitaxial layers grown on the template and enable thicker epitaxial layer growth. In some embodiments, the thickness of the single crystal layer 122 may be increased by epitaxial growth of silicon on the exfoliated silicon layer.

In some embodiments, adjusting the final thickness of the single crystal layer 122 may be achieved through thermal oxidation of a top portion of an exfoliated silicon layer, followed by an oxide layer strip with hydrofluoric acid (HF). For example, an exfoliated silicon layer having an initial thickness of 500 nm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for (SiO2:Si). A high etch selectivity may reduce the surface roughness by a similar factor from the initial surface roughness. However, the surface roughness of the resultant single crystal layer 122 may still be larger than desired. For example, a bulk Si (111) surface may have a root-mean-square (RMS) surface roughness of less than 0.1 nm as determined by a 2 μm×2 μm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 μm×30 μm AFM scan area.

If the surface roughness of the single crystal layer 122 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 5 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
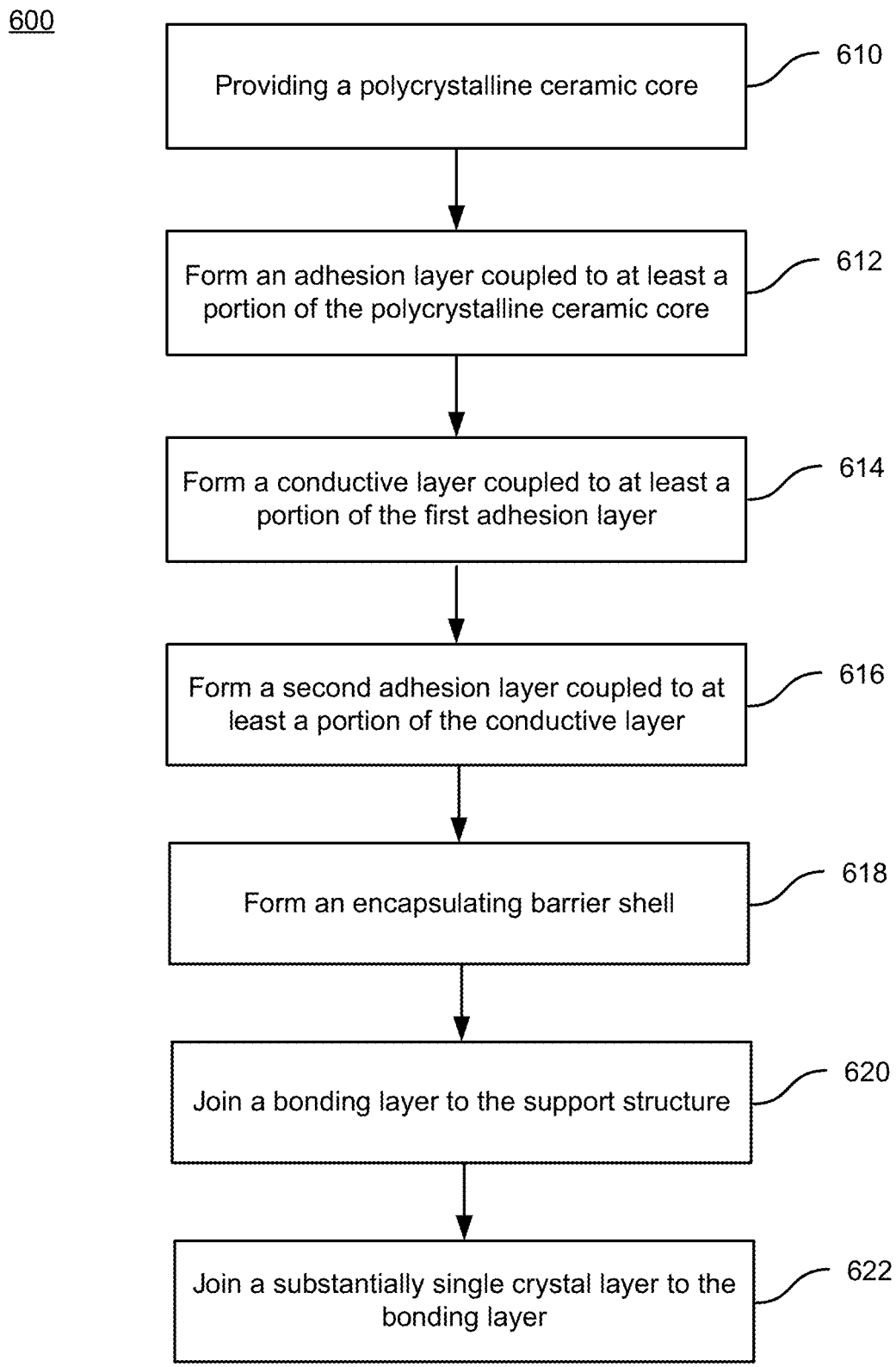
FIG. 6 is a simplified schematic diagram illustrating an epitaxial/engineered substrate structure for RF and power applications according to an embodiment of the present invention.

FIG. 6 is a simplified flowchart illustrating a method of fabricating an engineered substrate according to another embodiment of the present invention. The method includes forming a support structure by providing a polycrystalline ceramic core (610), forming an adhesion layer coupled to at least a portion of the polycrystalline ceramic core (612). The first adhesion layer can include a tetraethyl orthosilicate (TEOS) oxide layer. The first adhesion layer can be formed as a single layer of TEOS oxide. The method also includes forming a conductive layer coupled to the first adhesion layer (614). The conductive layer can be a polysilicon layer. The conductive layer can be formed as a single layer of polysilicon.

The method also includes forming a second adhesion layer coupled to at least a portion of the first adhesion layer (616) and forming a barrier shell (618). The second adhesion layer can be formed as a single layer of TEOS oxide. The barrier shell can be formed as a single layer of silicon nitride or a series of sub-layers forming the barrier shell.

Once the support structure is formed by processes 610-618, optionally, the method further includes joining a bonding layer (e.g., a silicon oxide layer) to the support structure (620). In some embodiments, a single crystal silicon layer or a substantially single crystal layer can be bonded to the silicon oxide layer (622). The joining of the bonding layer can include deposition of a bonding material followed by planarization processes as described herein. In an embodiment as described below, joining the single crystal layer (e.g., a single crystal silicon layer) to the bonding layer utilizes a layer transfer process in which the single crystal silicon layer is transferred from a silicon wafer.

It should be appreciated that the specific steps illustrated in FIG. 6 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 7 is a simplified schematic cross-sectional diagram illustrating an epitaxial/engineered substrate structure 700 for RF and power applications according to an embodiment of the present invention. In some LED applications, the engineered substrate structure provides a growth substrate that enables the growth of high quality GaN layers and the engineered substrate structure is subsequently removed. However, for RF and power device applications, the engineered substrate structure forms portions of the finished device and as a result, the electrical, thermal, and other properties of the engineered substrate structure or elements of the engineered substrate structure are important to the particular application.

Referring to FIG. 1, the single crystal layer 122 can be an exfoliated single crystal silicon layer split from a silicon donor wafer using an implant and exfoliation technique. Typical implants are hydrogen and boron. For power and RF device applications, the electrical properties of the layers and materials in the engineered substrate structure are of importance. For example, some device architectures utilize highly insulating silicon layers with resistance greater than 103 Ohm-cm to reduce or eliminate leakage through the substrate and interface layers. Other applications utilized designs that include a conductive silicon layer of a predetermined thickness (e.g., 1 μm) in order to connect the source of the device to other elements. Thus, in these applications, control of the dimensions and properties of the single crystal silicon layer is desirable. In design in which implant and exfoliation techniques are used during layer transfer, residual implant atoms, for example, hydrogen or boron, are present in the silicon layer, thereby altering the electrical properties. Additionally, it can be difficult to control the thickness, conductivity, and other properties of thin silicon layers, using, for example, adjustments in the implant dose, which can affect conductivity, and implant depth, which can affect layer thickness.

According to embodiments of the present invention, silicon epitaxy on an engineered substrate structure is utilized to achieve desired properties for the single crystal silicon layer as appropriate to particular device designs.

Referring to FIG. 7, the epitaxial/engineered substrate structure 700 includes an engineered substrate structure 710 and an epitaxial single crystal layer 720 formed thereon. In some embodiments, the epitaxial single crystal layer 720 can be a single crystal silicon layer. The engineered substrate structure 710 can be similar to the engineered substrate structures illustrated in FIGS. 1, 3, and 4. Typically, the single crystal layer 122 (for example, a single crystal silicon layer) is on the order of 0.5 μm after layer transfer. Surface conditioning processes can be utilized to reduce the thickness of the single crystal layer 122 to about 0.3 μm in some processes. In order to increase the thickness of the single crystal layer 122 to about 1 µm for use in making reliable ohmic contacts, for example, an epitaxial process is used to grow epitaxial single crystal layer 720 on the single crystal layer 122 formed by the layer transfer process. A variety of epitaxial growth processes can be used to grow epitaxial single crystal layer 720, including atomic layer deposition (ALD), CVD, LPCVD, MBE, or the like. The epitaxial single crystal layer 720 can include, for example, Si, SiC, sapphire, GaN, AlN, SiGe, Ge, Diamond, $Ga_2O_3$, and/or ZnO. The thickness of the epitaxial single crystal layer 720 can range from about 0.1 µm to about 20 µm, for example between 0.1 µm and 10 µm.

Figure 8A:
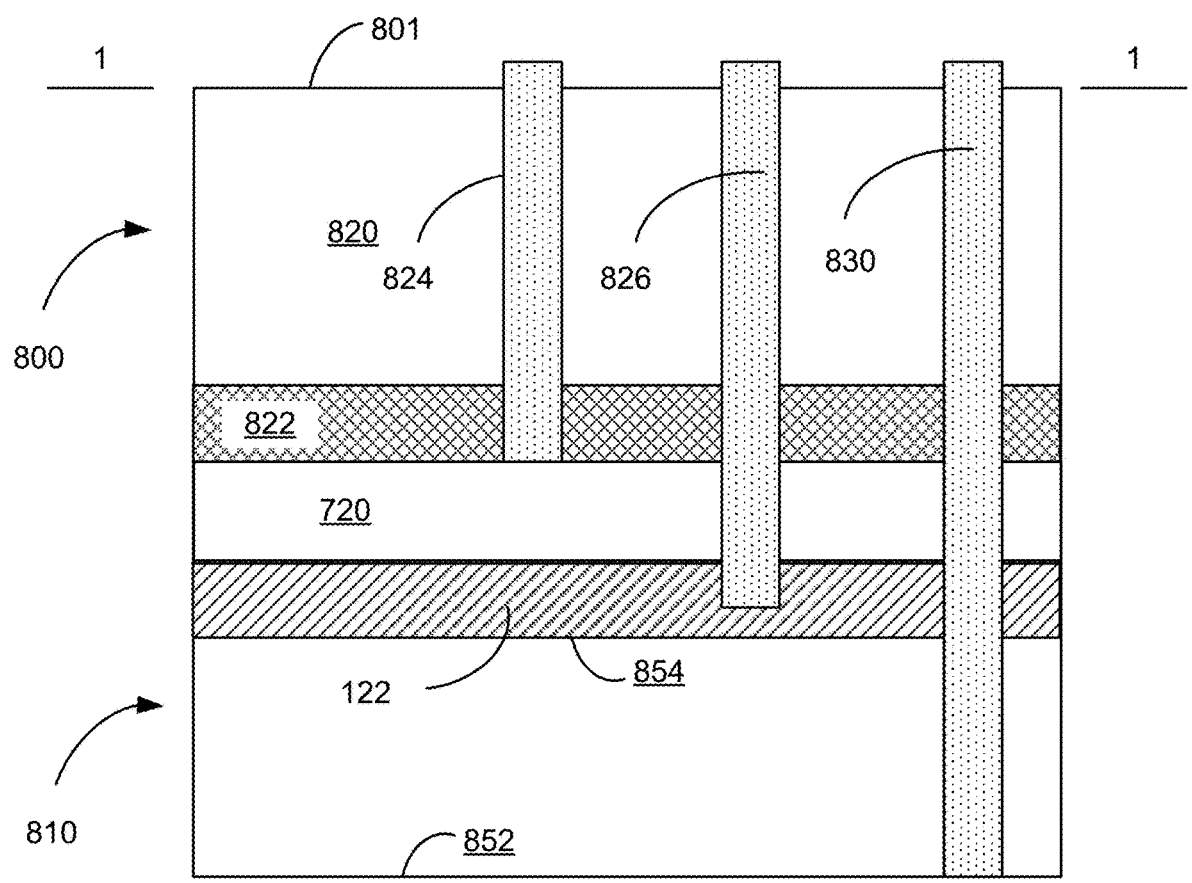
FIG. 8A is a simplified schematic diagram illustrating a III-V epitaxial layer on an engineered substrate structure according to an embodiment of the present invention.

FIG. 8A is a simplified schematic cross-sectional diagram illustrating an optional III-V epitaxial layer on an engineered substrate structure according to an embodiment of the present invention. The structure illustrated in FIG. 8A can be referred to as a double epitaxial structure 800 as described below. As illustrated in FIG. 8A, an engineered substrate structure 810 including an epitaxial single crystal layer 720 has an optional III-V epitaxial layer 820 formed thereon. In an embodiment, the III-V epitaxial layer comprises gallium nitride (GaN). In order to provide for electrical conductivity between portions of the III-V epitaxial layer, which can include multiple sub-layers, a set of vias 824 are formed passing, in this example, from a top surface 801 of the III-V epitaxial layer 820, into the epitaxial single crystal layer 720 through to the bottom of the engineered substrate structure 810. FIG. 8A shows the vias 824 extending through the epitaxial layer 820 to the epitaxial single crystal layer 720. As an example, these vias could be used to connect an electrode of a diode or a transistor to the underlying layer by providing an ohmic contact through the vias 824, thereby relaxing charge build up in the device. In some embodiments, one or more vias 824 may be insulated on its side wall so that it is not electrically connected to the III-V epitaxial layer 820. The electrical contact may facilitate the removal of parasitic charges, thereby enabling faster switching of the power device.

In some embodiments, the via 826 can extend to the single crystal layer 122. In order to address the difficulty of fabricating the via 826 to contact the single crystal layer 122, additional conducting epitaxial layers 822 can be grown on the single crystal layer 122 and single crystal layer 720 to increase the size of a target conducting layer for the via 826, that is, the thickness of the layer in which the via terminates. Epitaxial single crystal layer 720 and III-V epitaxial layers 820 can be formed thicker than on conventional substrates because of the unique CTE and diffusion properties of the engineered substrate structure 810. Therefore, existing substrate technologies cannot support the growth of enough defect free epitaxial layers to include conducting epitaxial layers 822 in a device. In some embodiments, the conducting epitaxial layers 822 can be AlN, AlGaN, GaN or a sufficiently doped semiconductor material. In particular embodiments, the thickness of the conducting epitaxial layers 822 can be 0.1-10 µm. In other embodiments, the thickness of the conducting epitaxial layers 822 can vary depending on the semiconductor device requirements. In some embodiments, the engineered substrate structure and the single crystal layer 122 can be removed, exposing the epitaxial single crystal layer 720 and or the conducting epitaxial layers 822. A contact can be formed on the exposed epitaxial layers after substrate removal. One of ordinary skill in the art would recognize many variations, modifications, and alternatives.

In some embodiments, the III-V epitaxial layer can be grown on the single crystal layer 122. In order to terminate the vias in the single crystal layer 122, an ohmic contact using the vias can be made in a 0.3 µm single crystal layer across an entire wafer. Utilizing embodiments of the present invention, it is possible to provide single crystal layers multiple microns in thickness. Multiple micron thickness is difficult to achieve using implant and exfoliation processes since large implant depth requires high implant energy. In turn, the thick epitaxial single crystal layers described herein enable applications such as the illustrated vias that enable a wide variety of device designs. In some embodiments, such as where the engineered substrate structure 810 is used as an interposer, one or more vias 830 can extend to the surface 852 of the engineered substrate structure 810.

In addition to increasing the thickness of the "layer" by epitaxially growing the epitaxial single crystal layer 720 on the single crystal layer 122, other adjustments can be made to the original properties of the single crystal layer 122, including modifications of the conductivity, crystallinity, and the like. For example, if a silicon layer on the order of 10 µm is desired before additional epitaxial growth of III-V layers or other materials, such a thick layer can be grown according to embodiments of the present invention.

The implant process can impact the properties of the single crystal layer 122, for example, residual boron/hydrogen atoms can cause defects that influence the electrical properties of a silicon crystal layer. In some embodiments of the present invention, a portion of the single crystal layer 122 can be removed prior to epitaxial growth of the epitaxial single crystal layer 720. For example, a single crystal silicon layer can be thinned to form a layer 0.1 µm in thickness or less, removing most or all of the residual boron/hydrogen atoms. Subsequent growth of a single crystal silicon layer is then used to provide a single crystal material with electrical and/or other properties substantially independent of the corresponding properties of the layer formed using layer transfer processes.

In addition to increasing the thickness of the single crystal silicon material coupled to the engineered substrate structure, the electrical properties, including the conductivity of the epitaxial single crystal layer 720, can be different from that of the single crystal layer 122. Doping of the epitaxial single crystal layer 720 during growth can produce P-type silicon by doping with boron and N-type silicon by doping with phosphorus. Undoped silicon can be grown to provide high resistivity silicon used in devices that have insulating regions. Insulating layers can be of use in RF devices, in particular.

The lattice constant of the epitaxial single crystal layer 720 can be adjusted during growth to vary from the lattice constant of the single crystal layer 122 to produce strained epitaxial material. In addition to silicon, other elements can be grown epitaxially to provide layers, including strained layers, that include silicon germanium, or the like. Additionally, the crystal orientation of the crystal planes, for example growth of (111) silicon on (100) silicon, can be utilized to introduce strain. For instance, buffer layers can be grown on the single crystal layer 122, on the epitaxial single crystal layer 720, or between layers, to enhance subsequent epitaxial growth. These buffer layers could include III-V semiconductor material layers such as aluminum gallium nitride, indium gallium nitride, and indium aluminum gallium nitride, silicon germanium strained layers, and the like. The strain of the III-V semiconductor material layers can be adjusted for desired material properties. Additionally, the buffer layers and other epitaxial layers can be graded in mole fraction, dopants, polarity, or the like. One of ordinary skill in the art would recognize many variations, modifications, and alternatives.

In some embodiments, strain present in the single crystal layer 122 or the epitaxial single crystal layer 720 may be relaxed during growth of subsequent epitaxial layers, including III-V epitaxial layers.

Figure 8B:
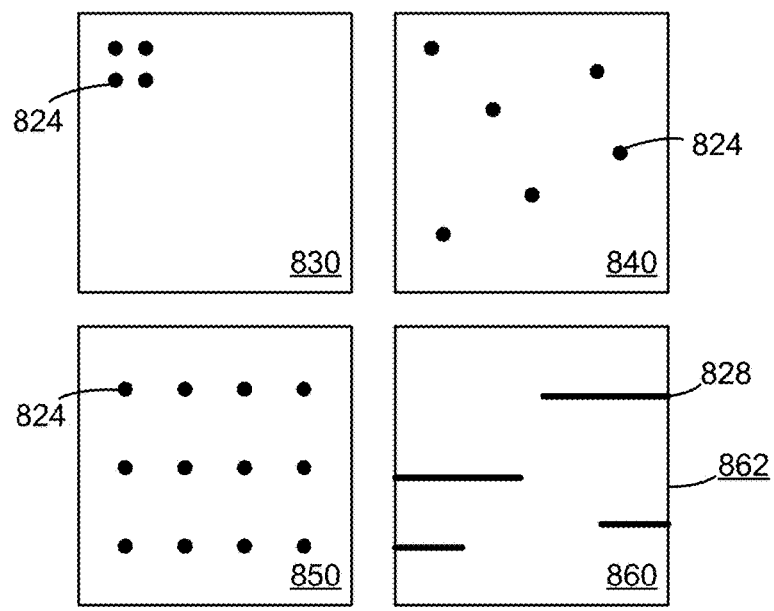
FIG. 8B is a simplified schematic plan view diagram illustrating via configurations for four engineered substrate structures according to an embodiment of the present invention.

FIG. 8B is a simplified schematic plan view diagram illustrating via configurations for four engineered substrate structures according to an embodiment of the present invention. The double epitaxial structures illustrated in FIG. 8B each include a set of vias 824. A first double epitaxial structure 830 shows a tight via configuration. A second double epitaxial structure 840 shows a dispersed via configuration. The dispersed via configuration uses vias 824 in active regions of the device more likely to experience charge build up. A third double epitaxial structure 850 shows a patterned via configuration. The patterned via configuration can space vias 824 equal distances across the double epitaxial structure 850. A fourth double epitaxial structure 860 illustrates lateral vias 828. Lateral vias 828 can be fabricated to travel substantially parallel to the epitaxial layers of the double epitaxial structure 860 and contact the single crystal layer 122 at, for example, an edge 862. In some embodiments, where the engineered substrate structure can be used as an interposer, the vias can extend from a first surface 852 of the engineered substrate structure to the a second surface 854 of the engineered substrate structure and/or the top surface 801 of the double epitaxial surface. One of ordinary skill in the art would recognize many variations, modifications, and alternatives.

The engineered substrates as described above may afford epitaxial growth of gallium nitride device layers thereon that are substantially lattice matched to the engineered substrates and are characterized by a coefficient of thermal expansion (CTE) that is substantially matched to that of the engineered substrates. Thus, engineered substrates may provide superior thermal stability and shape control. The engineered substrates may also enable wafer diameter scaling with reuse capability. Relatively thick (e.g., greater than 20 μm) high quality epitaxial gallium nitride layers may be formed on the engineered substrates that are crack free and characterized by low defect density and low post-epitaxial bow and stress. Multiple applications, such as power devices, radio frequency (RF) devices, monolithic microwave integrated circuits (MMICs), displays, light-emitting diodes (LEDs), and the like, may be implemented on a single platform. Such engineered substrates may also be suitable for various device architectures, such as lateral devices, vertical devices, chip scale package (CSP) devices, and the like.

Gallium nitride (GaN) and similar wide bandgap semiconductor materials offer physical and electrical properties superior to those of silicon, which allow for power semiconductor devices based on these materials to withstand high voltages and temperatures. These properties also permit higher frequency response, greater current density and faster switching. The continuous drive for greater power density at the device and package levels creates consequences in terms of higher temperatures and temperature gradients across the package. Using engineered substrates for forming CTE-matched epitaxial device layers may alleviate many thermal-related failure mechanisms common for wide bandgap devices, as described below.

Compound semiconductor devices, such as gallium nitride (GaN) based high electron mobility transistors (HEMTs), may be subjected to high electric fields and high currents (e.g., large signal RF), while being driven into deep saturation. Contact degradation, inverse piezoelectric effects, hot electron effects, and self-heating are among some of the common problems. For example, Schottky and ohmic contacts may show an increase in contact resistance and exhibit passivation cracking for temperatures greater than about 300° C. Inter-diffusion within the gate metal stack and gallium out-diffusion into the metal layers may occur. Hot electron effects may occur when electrons accelerated in a large electric field gain very high kinetic energy. The hot electron effect may lead to trap formation in aluminum gallium nitride (AlGaN) layers, at AlGaN/GaN interfaces, at passivation layer/GaN cap layer interfaces, and in buffer layers.

Trap formation may in turn cause current collapse and gate lag, and thereby result in reversible degradations of transconductance and saturated drain current. Slow current transients are observed even if the drain voltage or gate voltage is changed abruptly. The slow transient response of the drain current when the drain-source voltage is pulsed is called the drain lag, or gate lag in the case of the gate-source voltage. When the voltage within the pulse is higher than the quiescent bias point, the buffer traps capture free charges. This phenomenon is very fast compared to the pulse length. When the voltage within the pulse is lower than the quiescent bias point, the traps release their charges. This process can be very slow, possibly even in a few seconds. As the free carriers are captured and released, they do not contribute to the output current instantaneously. This phenomenon is at the origin of current transients.

The combined effect of drain lag and gate lag leads to current collapse (reduction in the two-dimensional electron gas [2-DEG] density). The gate lag due to buffer traps becomes more pronounced when the deep-acceptor density in the buffer layer is higher. The inverse piezoelectric effect may occur when high reverse bias on the gate leads to crystallographic defect generation. Beyond a certain critical voltage, irreversible damage to a device may occur, which can provide a leakage path through the defects. Self-heating may occur under high power stress and may result in thermal stress-strain. Compound semiconductor devices may also suffer from electric field driven degradations, such as gate metallization and degradations at contacts, surfaces, and interfaces. Gate degradations may lead to increases in leakage current and dielectric breakdown. Accordingly, embodiments of the present invention reduce and/or eliminate the shortcomings discussed in relation to conventional semiconductor devices.

High Temperature Reverse Bias (HTRB) testing is one of the most common reliability tests for power devices. An HTRB test evaluates long-term stability under high drain-source bias. HTRB tests are intended to accelerate failure mechanisms that are thermally activated through the use of biased operating conditions. During an HTRB test, the device samples are stressed at or slightly less than the maximum rated reverse breakdown voltage at an ambient temperature close to their maximum rated junction temperature over an extended period (e.g., 1,000 hours). This tests high temperature accelerates failure mechanisms according to the Arrhenius equation, which states the temperature dependence of reaction rates. Delamination, popping, device blow-up, and other mechanical issues may occur during HTRB tests. Using a CTE matched core for devices may mitigate the thermal cracking issues that lead to early device failure.

Failure mechanisms similar to time-dependent dielectric breakdown (TDDB), a common failure mechanism in MOSFETs, are also observed in gate dielectrics of wide bandgap semiconductor devices, such as GaN power devices. TDDB happens when the gate dielectric breaks down because of long-time application of relatively low electric field (as opposite to immediate breakdown, which is caused by strong electric field). In addition, failures during temperature cycling (TMCL) may be related to package stress, bond pad metallization, mold compound, moisture sensitivity, and other package-level issues. The solution is to match thermal properties as close as possible in the layers.

As discussed above, the engineered substrates may have CTEs matched to that of one or more of the epitaxial GaN device layers grown thereon. The epitaxial GaN device layers may also be lattice matched to the engineered substrates. Therefore, the epitaxial GaN device layers may have lower defect densities and higher qualities. Relatively thick drift regions may be formed by epitaxial growth. Also, large diameter wafers may be made from the engineered substrates, thereby lower manufacturing costs. The engineered substrates may improve device reliability. For example, having CTEs matched to that of the epitaxial GaN devices may help mitigate thermal stress, which is a critical factor in device reliability. Device failures related to thermal stress may include thermally-activated drain-source breakdown, punch through effect, breakdown along the channel, and breakdown through the buffer layer. Self-heating may also be reduced. In addition, high quality epitaxial GaN layers with low defect density may help improve device reliability, as some defects may be activated with voltage stress and may contribute to lateral and vertical leakage. High quality epitaxial GaN layers may also address issues such as localized non-stoichiometric regions that can affect field distributions and dislocation densities.

Traditional silicon-based MOSFET technology is nearing the physical limit of performance and switching speeds. Lateral GaN-based high electron mobility transistors (HEMTs) offer an opportunity to go beyond the silicon-based MOSFET realm in medium to low-power systems, such as solar inverters, compact power supply (PFC), switch-mode power supply (SMPS), motor drives, RF power amplifiers, solid state lighting (SSL), smart grid, and automotive motor drive systems. Lateral GaN-based HEMTs may afford high efficiency, high-frequency operation, and low switching and conduction loss, among many other advantages.

Some embodiments of the present invention use the mechanical and electrical properties provided by the engineered substrate to integrate different device types, such as lateral GaN-based power devices and optoelectronics, into a system of stacked devices.

Figure 9:
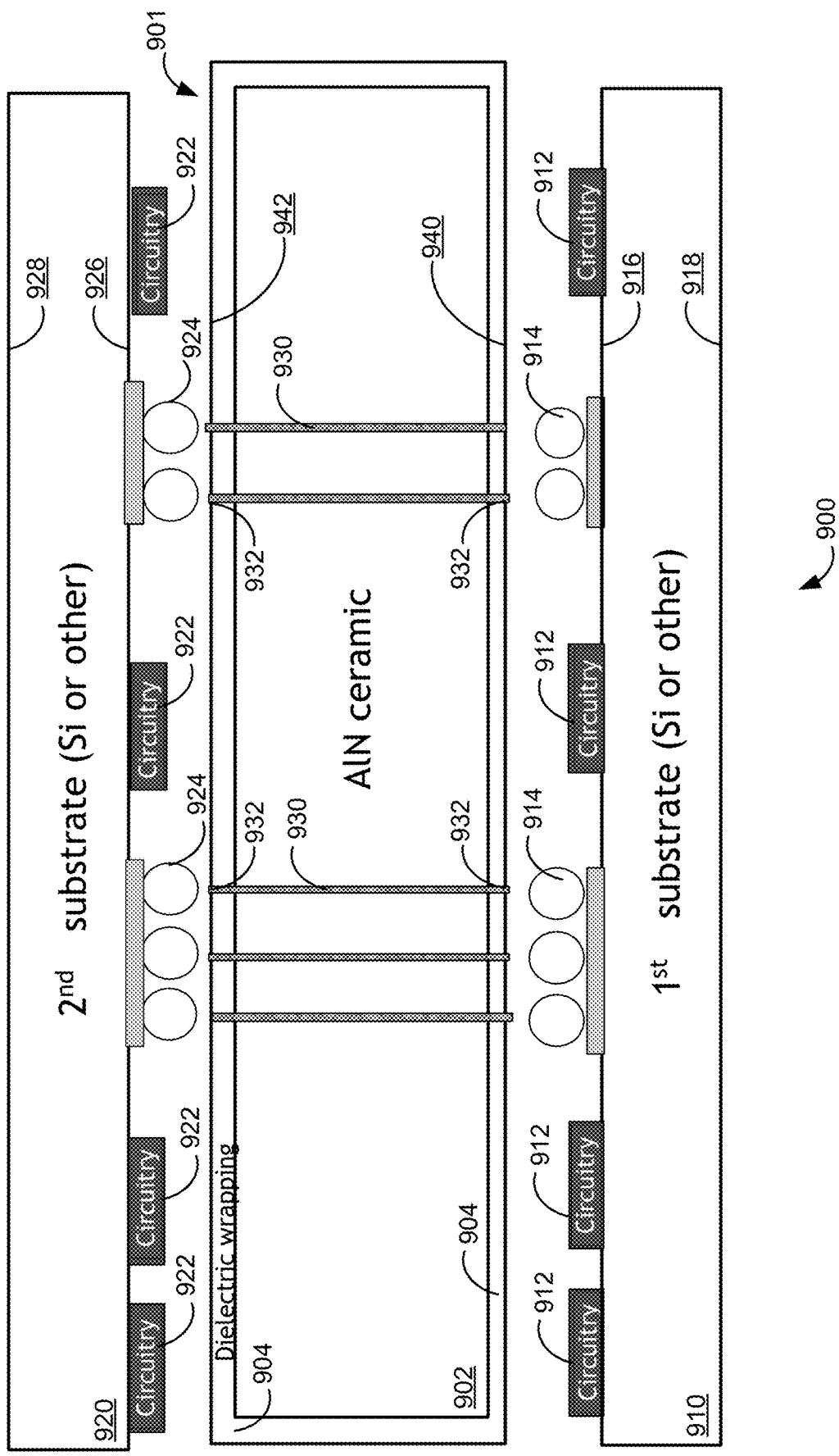
FIG. 9 is a simplified schematic diagram illustrating a first substrate and a second substrate coupled through an interposer according to an embodiment of the present invention.

FIG. 9 is a simplified schematic diagram illustrating a first substrate 910 and a second substrate 920 coupled through an interposer 901 according to some embodiments of the present invention. The system of stacked devices 900 illustrated in FIG. 9 may be formed using an engineered substrate structure, similar to the engineered substrate structure illustrated in FIG. 1, as an interposer 901.

The engineered substrate structure 901 may include a polycrystalline ceramic core 902 such as AlN. The polycrystalline ceramic core 902 may be encapsulated by one or more layers 904. In some embodiments, similar to the engineered substrate illustrated in FIG. 1, the one or more layers 904 may include a first adhesion layer (e.g., the first adhesion layer 112 shown in FIG. 1) encapsulating the polycrystalline ceramic core 902, a conductive layer (e.g., the conductive layer 114 shown in FIG. 1) encapsulating the first adhesion layer, a second adhesion layer (e.g., the second adhesion layer 116 shown in FIG. 1) encapsulating the conductive layer, and a barrier layer (e.g., the barrier layer 118 shown in FIG. 1) encapsulating the second adhesion layer. In some embodiments, the one or more layers 904 may include only one adhesion layer encapsulating the polycrystalline ceramic core 902, and a barrier layer encapsulating the adhesion layer. The barrier layer may comprise a dielectric material that can make the interposer 901 compatible with standard silicon foundry requirements.

Figure 16:
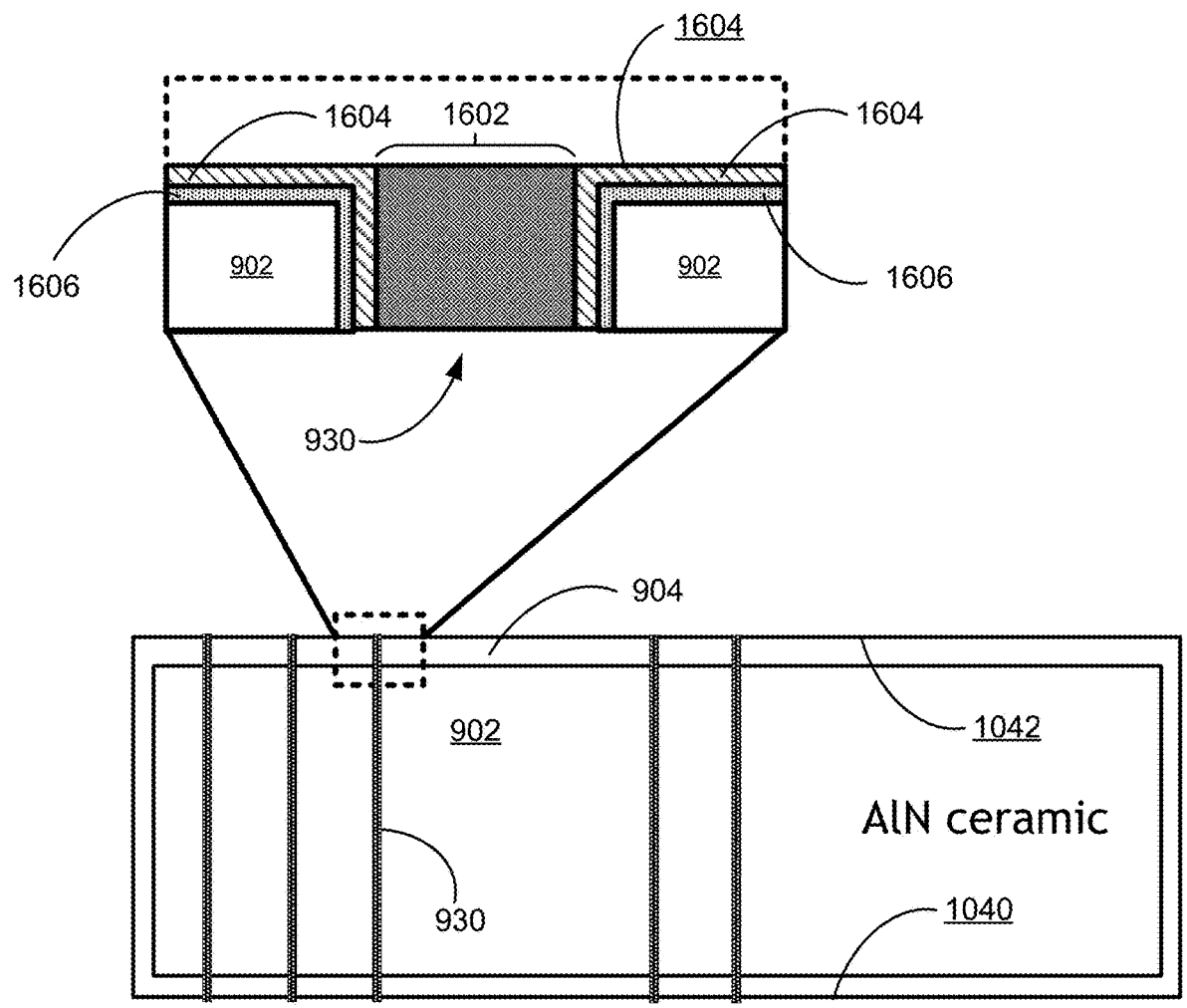
FIG. 16 is an expanded view of a planarized through-wafer via at a first surface of an interposer according to an embodiment of the present invention.

The interposer 901 can include one or more vias 930. Each via 930 may extend from a first surface 940 of the interposer 901 to a second surface 942 of the interposer 901 opposite to the first surface 940 through the polycrystalline ceramic core 902 and the one or more layers 904 (e.g., including an adhesion layer and a barrier layer). The one or more vias 930 can be fabricated by removing material from the polycrystalline ceramic core 902 using laser drilling, etching processes, or the like. As illustrated in FIG. 16 and discussed below, the one or more layers 904 may include an adhesion layer 1606 and a barrier layer 1604 that cover the sidewalls of each via 930. After forming the barrier layer 1604, a conductive material can be deposited to fill each via 930. The one or more vias 930 may provide an electrical connection between the first surface 940 and the second surface 942 of the interposer 901.

The system of stacked devices 900 can further include a first wafer 910 and a second wafer 920. Each wafer can function as a substrate for one or more semiconductor devices. For example, the first wafer 910 includes four semiconductor devices 912 on a first surface 916 adjacent to the interposer 901. The semiconductor devices 912 can be in electrical contact with one or more solder bumps 914 formed on the first surface 916 of the first wafer 910. The second wafer 920 can include one or more semiconductor devices 922 on a first surface 926 adjacent to the interposer 901. The semiconductor devices 922 can be in electrical contact with one or more solder bumps 924 formed on the first surface 926 of the second wafer 920. The solder bumps 914 and 924 can be positioned to correspond with the one or more vias 930. In some embodiments the one or more vias 930 can include bonding pads 932 on one or more ends. Electrical contact between first wafer 910, the one or more vias 930 and the second wafer 920 can be formed by coupling the solder bumps to the bonding pads. In some embodiments, the first wafer 910 and the second wafer 920 can be mechanically and/or electrically attached to the interposer 901 using the solder bumps.

In some embodiments, the semiconductor devices 912 and 922 can be any combination of CMOS devices and circuitry. For example, the devices can include photodetectors; photo-emitters; analog circuitry; digital circuitry; power devices; sensor circuits; detector circuits; imaging devices; memory devices and the like.

Figure 10:
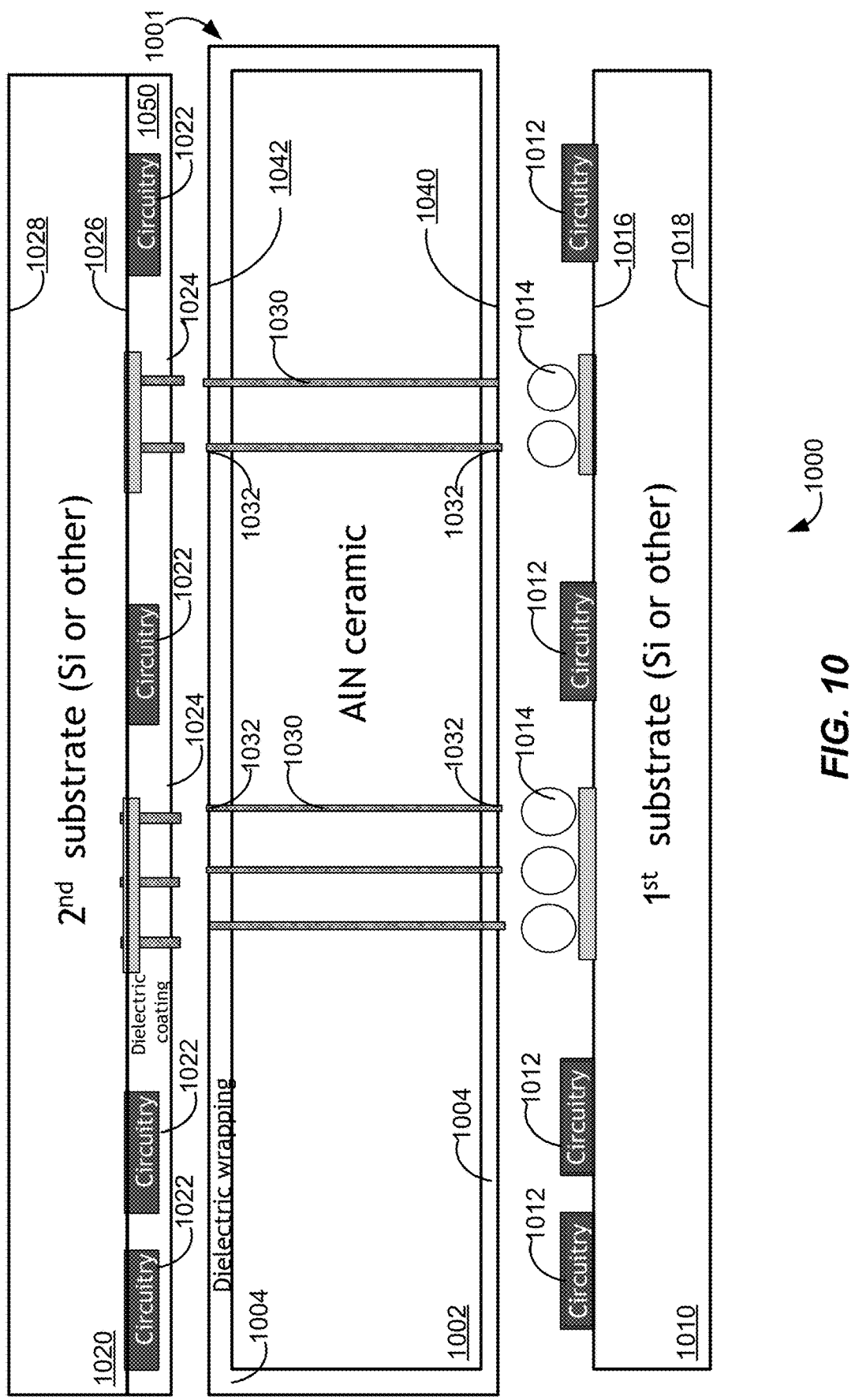
FIG. 10 is a simplified schematic diagram illustrating a first substrate and a second substrate with a dielectric coating coupled through an interposer according to an embodiment of the present invention.

FIG. 10 is a simplified schematic diagram illustrating a first substrate and a second substrate with a dielectric coating coupled through an interposer according to an embodiment of the present invention. The system of stacked devices 1000 illustrated in FIG. 10 is formed using an engineered substrate structure as an interposer 1001. As discussed above the engineered substrate structure can include a polycrystalline ceramic core 1002 such as AlN. The polycrystalline ceramic core can be encapsulated by one or more layers such as a barrier layer 1004. In some embodiments, the barrier layer 1004 can comprise a dielectric material. The barrier layer 1004 can be fabricated to make the interposer 1001 compatible with standard Si foundry requirements. The interposer 1001 can include one or more vias 1030. The one or more vias 1030 can be fabricated to provide an electrical connection between a first interposer surface 1040 and a second interposer surface 1042.

The system of stacked devices 1000 can further include a first wafer 1010 and a second wafer 1020. Each wafer can function as a substrate for one or more semiconductor devices. For example, the first wafer 1010 includes four semiconductor devices 1012 on a first surface 1016 adjacent to the interposer 1001. The semiconductor devices 1012 can be in electrical contact with one or more solder bumps 1014 formed on the first surface 1016 of the first wafer 1010. The second wafer 1020 can include one or more semiconductor devices 1022 on a first surface 1026 adjacent to the interposer 1001. In some embodiments, a dielectric coating 1050 can be coupled to the first surface 1026 of the second wafer 1020. The semiconductor devices 1022 can be in electrical contact with vias 1024 formed form the first surface 1026 of the second wafer 1020 through the dielectric coating 1050. The dielectric coating 1050 and the vias 1024 formed on the second wafer 1020 can be planarized using CMP or the like. The solder bumps 1014 and vias 1024 can be positioned to correspond with the one or more vias 1030. In some embodiments the one or more vias 1030 can include bonding pads 1032 on one or more ends.

Electrical contact between first wafer 1010 and the one or more vias 1030 can be formed by coupling the solder bumps 1014 to the bonding pads 1032. In some embodiments, the first wafer 1010 can be mechanically attached to the interposer 1001 using the solder bumps 1014. In some embodiments, electrical contact between the second wafer 1020 and the one or more vias 1030 can be formed by bonding the second wafer 1020 to the interposer 1001. Bonding the second wafer 1020 to the interposer 1001 is facilitated by the dielectric coating 1050.

Figure 11:
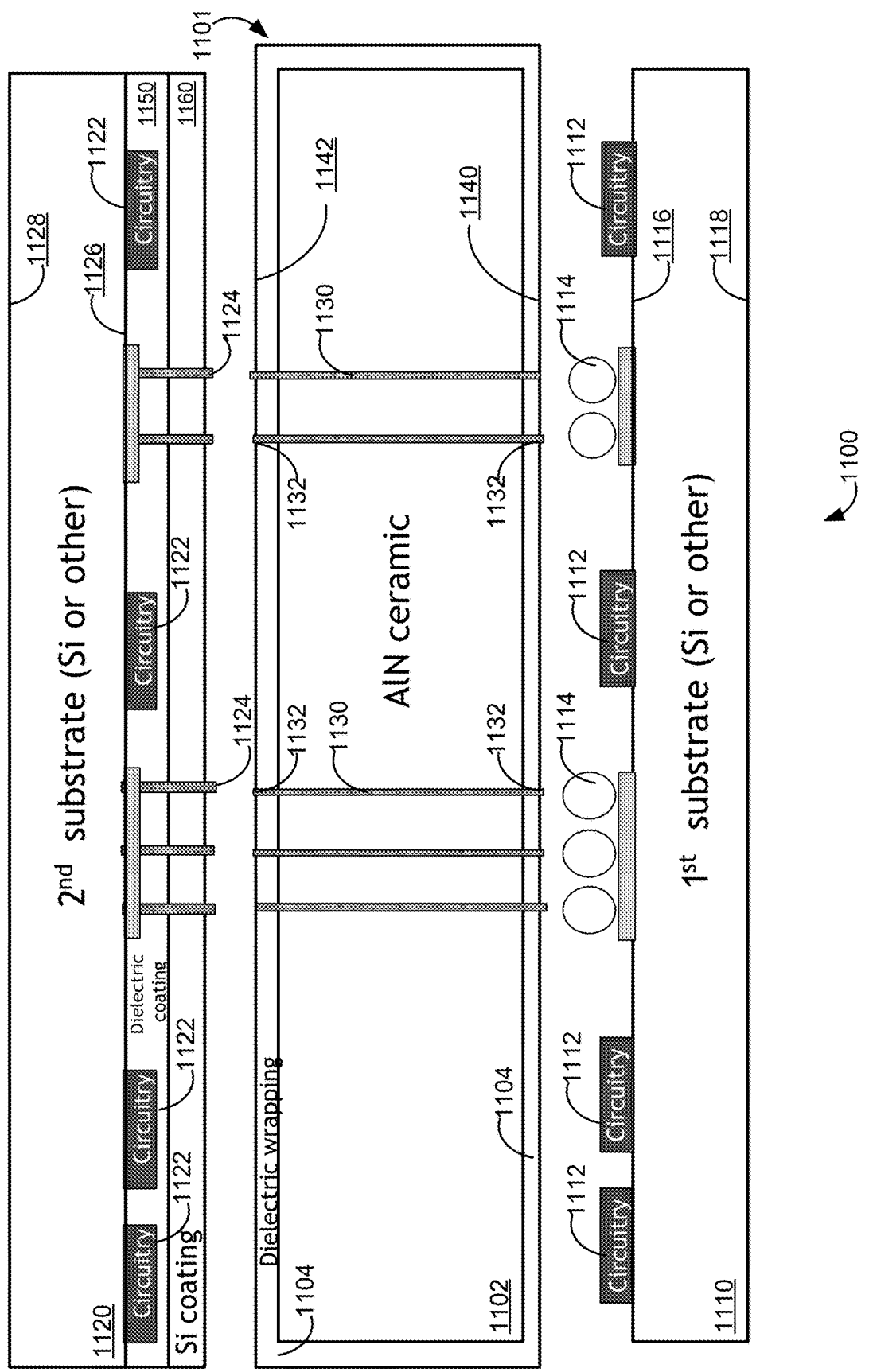
FIG. 11 is a simplified schematic diagram illustrating a first substrate and a second substrate with a dielectric coating and a silicon coating coupled through an interposer according to an embodiment of the present invention.

FIG. 11 is a simplified schematic diagram illustrating a first substrate and a second substrate with a dielectric coating and a silicon coating coupled through an interposer according to an embodiment of the present invention. The system of stacked devices 1100 illustrated in FIG. 11 is formed using an engineered substrate structure as an interposer 1101 bonded to a wafer using an oxide-to-silicon bond. The structures in FIG. 11 are similar those described in FIG. 10. In some embodiments, the second wafer 1120 can include a dielectric coating 1150. A silicon coating 1160 can be formed on the dielectric coating 1150. In some embodiments, after forming the silicon coating 1160, vias 1124 can be fabricated through the silicon coating 1060 and the dielectric coating 1150. After fabricating the vias 1124, the second wafer can be planarized. The silicon coating 1160 can be bonded to the barrier layer 1104 of interposer 1101. In some embodiments, the barrier layer can be an oxide layer.

Figure 12:
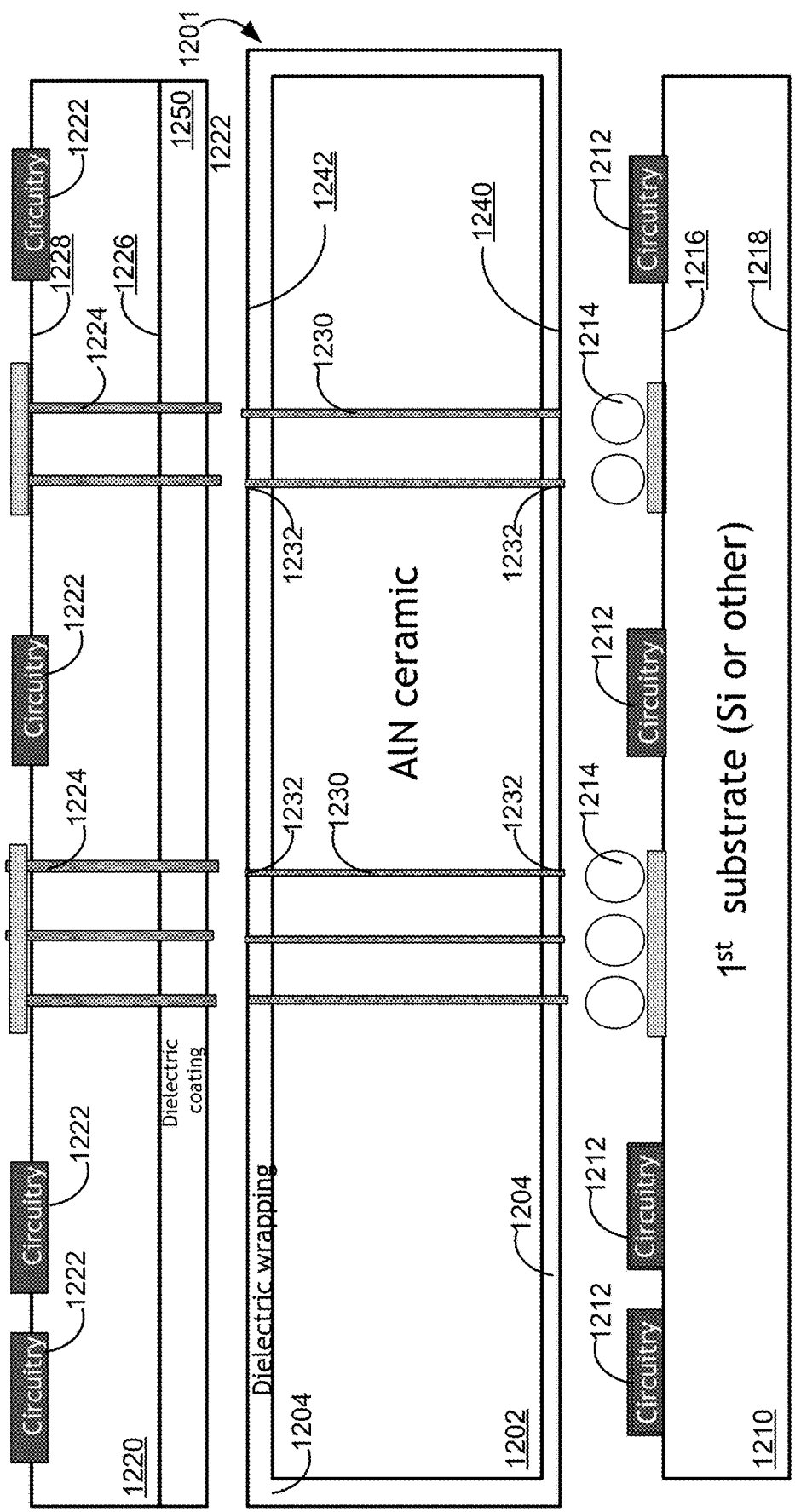
FIG. 12 is a simplified schematic diagram illustrating a first substrate coupled through an interposer to a second substrate with a dielectric coating to form a bonding surface and devices disposed on a surface opposed to the bonding surface according to an embodiment of the present invention.

FIG. 12 is a simplified schematic diagram illustrating a first substrate coupled through an interposer to a second substrate with a dielectric coating to form a bonding surface and devices disposed on a surface opposed to the bonding surface according to an embodiment of the present invention. The system of stacked devices 1200 illustrated in FIG. 12 is formed using an engineered substrate structure as an interposer 1201. As discussed above the engineered substrate structure can include a polycrystalline ceramic core 1202 such as MN. The polycrystalline ceramic core can be encapsulated by one or more layers such as a barrier layer 1204. In some embodiments, the barrier layer 1204 can comprise a dielectric material. The barrier layer 1204 can be fabricated to make the interposer 1201 compatible with standard Si foundry requirements. The interposer 1201 can include one or more vias 1230. The one or more vias 1230 can be fabricated to provide an electrical connection between a first interposer surface 1240 and a second interposer surface 1242.

The system of stacked devices 1200 can further include a first wafer 1210 and a second wafer 1220. Each wafer can function as a substrate for one or more semiconductor devices. For example, the first wafer 1210 includes four semiconductor devices 1212 on a first surface 1216 adjacent to the interposer 1001. The semiconductor devices 1212 can be in electrical contact with one or more solder bumps 1214 formed on the first surface 1216 of the first wafer 1210. In some embodiments, the second wafer 1220 can include one or more semiconductor devices 1222 on a second surface 1228 opposite a first surface 1226 that is adjacent to the interposer 1201. In some embodiments, a dielectric coating 1250 can be coupled to the first surface 1226 of the second wafer 1220. The semiconductor devices 1222 can be in electrical contact with through-wafer vias 1224 formed form the second surface 1226 of the second wafer 1220 through the dielectric coating 1250. The dielectric coating 1250 and the vias 1224 formed on the second wafer 1220 can be planarized using CMP or the like. The solder bumps 1214 and vias 1224 can be positioned to correspond with the one or more vias 1230 fabricated on the interposer 1201. In some embodiments the one or more vias 1230 can include bonding pads 1032 on one or more ends.

Electrical contact between first wafer 1210 and the one or more vias 1230 can be formed by coupling the solder bumps 1214 to the bonding pads 1232. In some embodiments, the first wafer 1210 can be mechanically attached to the interposer 1201 using the solder bumps 1214. In some embodiments, electrical contact between the second wafer 1220 and the one or more vias 1230 can be formed by bonding the second wafer 1220 to the interposer 1201. Bonding the second wafer 1220 to the interposer 1201 is facilitated by the dielectric coating 1250. In some embodiments, the semiconductor devices 1212 on the first wafer 1210 can be formed on a second wafer surface 1218 opposite from the first wafer surface 1216 adjacent to the interposer. In this embodiment, the first wafer 1210 can include vias to connect the semiconductor devices 1212 to the interposer 1201.

Figure 13:
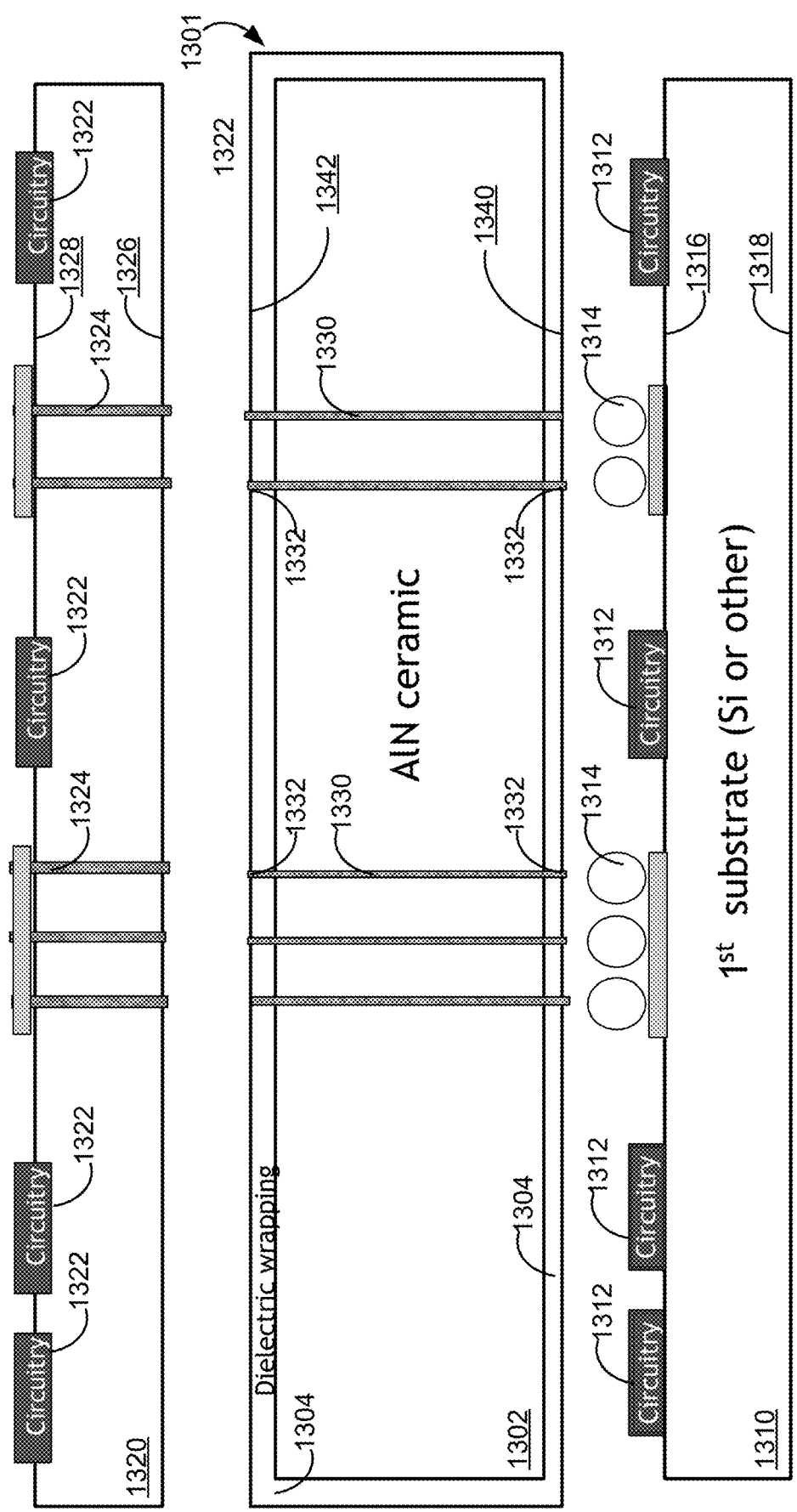
FIG. 13 is a simplified schematic drawing illustrating a first substrate coupled through an interposer to a second substrate with a bonding surface and devices disposed on a surface opposed to the bonding surface according to an embodiment of the present invention.

FIG. 13 is a simplified schematic drawing illustrating a first substrate coupled through an interposer to a second substrate with a bonding surface and devices disposed on a surface opposed to the bonding surface according to an embodiment of the present invention. The system of stacked devices 1300 illustrated in FIG. 13 is formed using an engineered substrate structure as an interposer 1301 bonded to a wafer using an oxide-to-wafer bond. The structures in FIG. 13 are similar those described in FIG. 12 with the one or more semiconductor devices 1322 disposed on a second surface 1328 disposed opposite from a first surface 1326 adjacent to the interposer 1301. In some embodiments, after fabricating the vias 1324, the second wafer can be planarized. The second wafer 1320 can be bonded to the barrier layer 1304 of interposer 1301. In some embodiments, through wafer vias 1324 can be coupled to solder bumps (not pictured) at the first surface 1326. In these embodiments, the solder bumps at the first surface 1326 can be coupled to bonding pads 1332 on the second surface 1342 of the interposer 1301.

Figure 14:
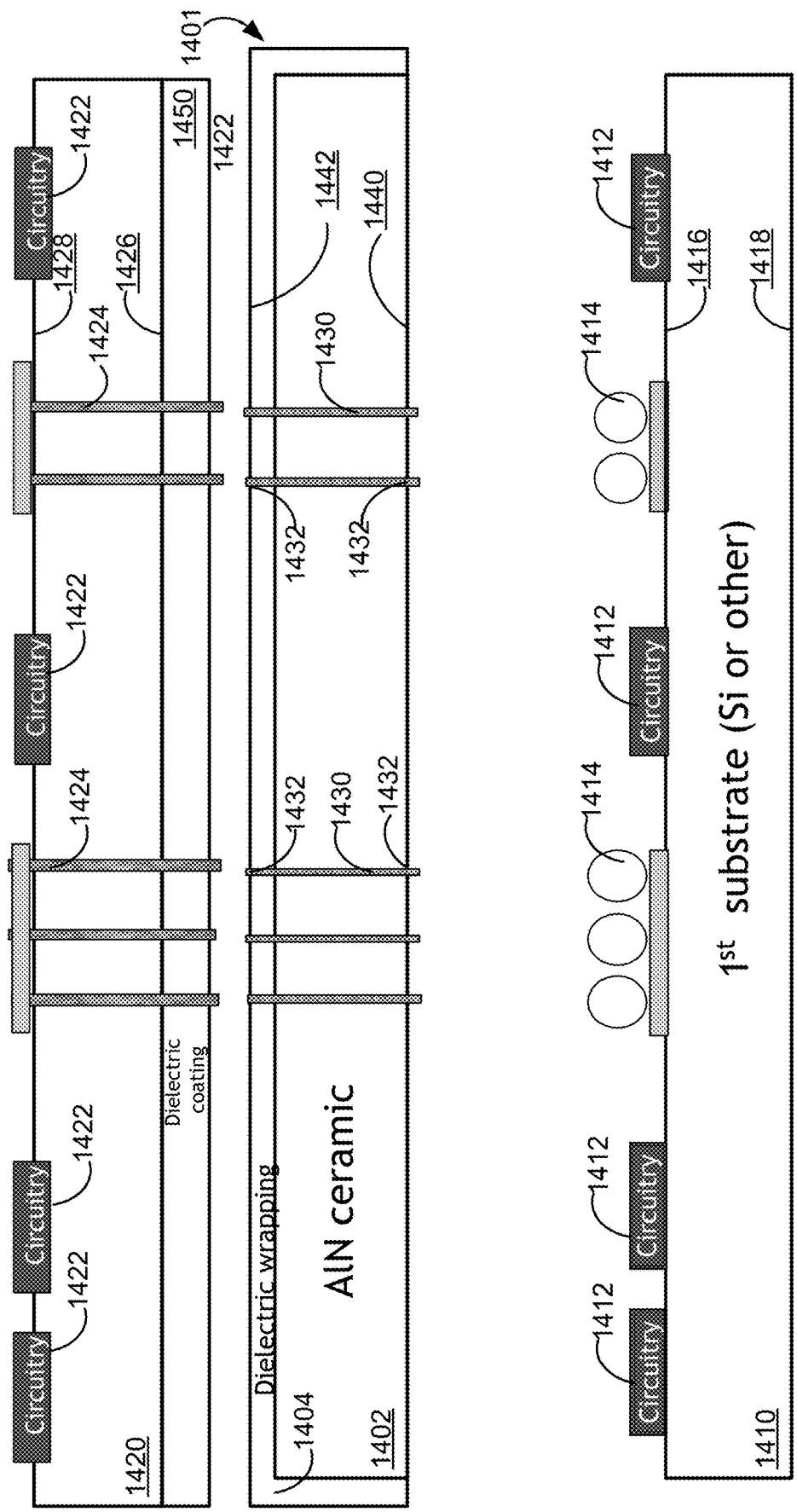
FIG. 14 is a simplified schematic diagram illustrating a first substrate and a second substrate with a dielectric coating coupled through a thinned interposer according to an embodiment of the present invention.

FIG. 14 is a simplified schematic diagram illustrating a first substrate and a second substrate with a dielectric coating coupled through a thinned interposer according to an embodiment of the present invention. The system of stacked devices 1400 illustrated in FIG. 14 is formed using an engineered substrate structure as an interposer 1401. In some embodiments, the interposer 1401 can be thinned depending on the particular application. The structures in FIG. 14 are similar those described in FIG. 12. In some embodiments, the second wafer 1420 can include a dielectric coating 1450. Vias 1424 can be fabricated through the dielectric coating 1150. After fabricating the vias 1424, the second wafer can be planarized. The dielectric coating 1450 can be bonded to the barrier layer 1404 of interposer 1401. In some embodiments, the barrier layer can be an oxide layer. In some embodiments, a thinned interposer 1401 can be used to reduce the resistance and/or the inductance between the first wafer 1410 and the second wafer 1420. In some embodiments, one or more thinned interposers 1401 can be used to reduce the device profile in a multi-layer device. In some embodiments, portions of the polycrystalline ceramic core 1402 can be exposed on the first surface 1440 of the thinned interposer 1401. In some embodiments, polycrystalline ceramic core can be coated with the barrier layer 1404. Next, the interposer 1401 can be thinned using mechanical grinding, chemical mechanical polishing or the like.

Figure 15:
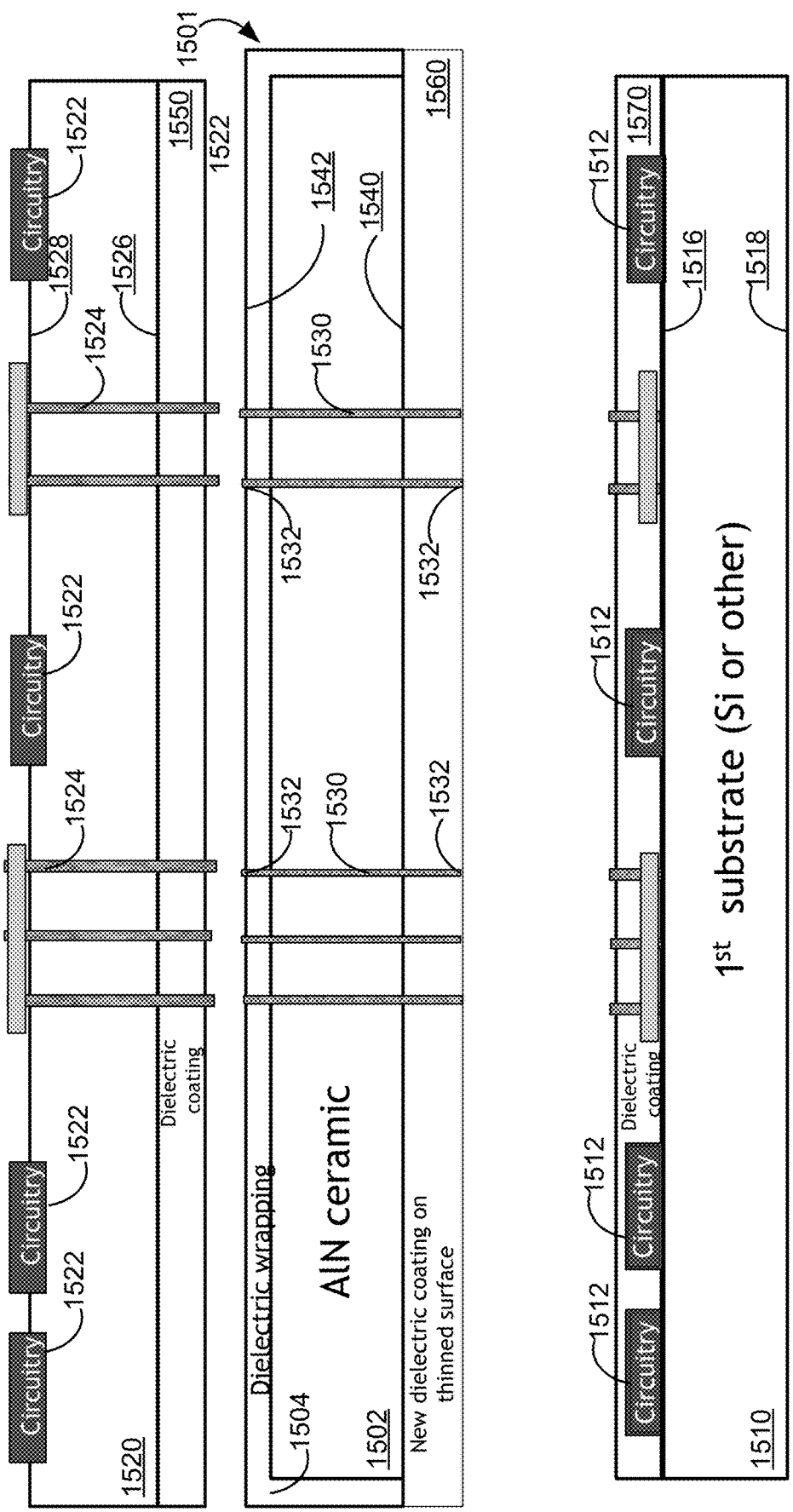
FIG. 15 is a simplified schematic diagram illustrating a first substrate, a second substrate and a thinned interposer with a dielectric coating on a thinned surface according to an embodiment of the present invention.

FIG. 15 is a simplified schematic diagram illustrating a first substrate, a second substrate and a thinned interposer with a dielectric coating on a thinned surface according to an embodiment of the present invention. The system of stacked devices 1500 illustrated in FIG. 15 is formed using an engineered substrate structure as an interposer 1501. In some embodiments, the interposer 1501 can be thinned depending on the particular application. The structures in FIG. 15 are similar those described in FIG. 14. In some embodiments, the second wafer 1520 can include a dielectric coating 1550. Vias 1524 can be fabricated through the dielectric coating 1550. After fabricating the vias 1524, the second wafer can be planarized. The dielectric coating 1550 can be bonded to the barrier layer 1504 of interposer 1501. In some embodiments, the barrier layer can be an oxide layer.

In some embodiments, portions of the polycrystalline ceramic core 1502 can be exposed on the first surface 1540 of the thinned interposer 1501. In some embodiments, polycrystalline ceramic core can be coated with the barrier layer 1504. Next, the interposer 1501 can be thinned using mechanical grinding, chemical mechanical polishing or the like. After the interposer 1501 is thinned, a second dielectric coating 1560 can be formed on the exposed portions of the polycrystalline ceramic core 1502 on the first surface 1540. In some embodiments, the first wafer 1510 can include a first wafer dielectric coating 1570 for bonding the first wafer 1510 to the interposer 1501 at the interface between the first wafer dielectric coating 1570 and the second dielectric coating 1560.

FIG. 16 is an expanded view of a planarized through-wafer via at a first surface of an interposer according to an embodiment of the present invention. The one or more vias 930 can be fabricated by removing material from the polycrystalline ceramic core 902 using laser drilling, etching processes, or the like. Next, the one or more layers comprising the engineered substrate structure may be formed on the polycrystalline ceramic core 902. For example, the one or more layers may include an adhesion layer 1606 encapsulating the polycrystalline ceramic core 902, and a barrier layer 1604 encapsulating the adhesion layer 1606. As illustrated, the adhesion layer 1606 and the barrier layer 1604 may cover the sidewalls of each via 930. In some embodiments, the one or more layers may also include a conductive layer (e.g., similar to the conductive layer 114 illustrated in FIG. 1) encapsulating the adhesion layer 1606, and a second adhesion layer (e.g., similar to the adhesion layer 116 illustrated in FIG. 1) encapsulating the conductive layer, which is encapsulated by the barrier layer 1604.

The thickness of the one or more layers, including the adhesion layer 1606 and the barrier layer 1604, can be substantially less than the cross-section 1602 of each via 930. In some embodiments, the cross section can be 10 µm-100 µm. After forming the barrier layer 904, a conductive material can be deposited to form each via 930. After depositing the conductive material, the surface 1604 can be planarized using chemical mechanical planarization (CMP) or the like. Although solder bumps and bonding pads are used herein, any suitable method of contact may be used to form an electrical connection between a wafer and the interposer.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An interposer for gallium nitride based semiconductor devices, the interposer comprising:
    a polycrystalline ceramic core disposed between a first surface and a second surface of the interposer, wherein the polycrystalline ceramic core comprises a material characterized by a coefficient of thermal expansion (CTE) that is substantially matched to CTE of gallium nitride;
    an adhesion layer encapsulating the polycrystalline ceramic core;
    a conductive layer coupled to the adhesion layer;
    a barrier layer encapsulating the adhesion layer and the conductive layer, the barrier layer comprising an electrically non-conductive material, wherein the conductive layer is disposed between the adhesion layer and the barrier layer; and
    one or more electrically conductive vias extending from the first surface to the second surface through the polycrystalline ceramic core, the adhesion layer, the conductive layer, and the barrier layer.

2. The interposer of claim 1 wherein the barrier layer surrounds side walls of the one or more electrically conductive vias.

3. The interposer of claim 1 wherein the polycrystalline ceramic core comprises polycrystalline aluminum nitride.

4. The interposer of claim 1 wherein the adhesion layer comprises tetraethyl orthosilicate.

5. The interposer of claim 1 wherein the conductive layer comprises one or more lateral conductive interconnects.

6. The interposer of claim 1 further comprising a second adhesion layer encapsulating the conductive layer, wherein the barrier layer encapsulates the second adhesion layer.

7. The interposer of claim 6 wherein the conductive layer comprises polysilicon, and the second adhesion layer comprises tetraethyl orthosilicate.

8. The interposer of claim 1 wherein the barrier layer comprises silicon nitride.

9. The interposer of claim 1 wherein the one or more electrically conductive vias have a diameter of about 10-100 µm.

10. The interposer of claim 1 wherein the one or more electrically conductive vias comprise a metallic material.

11. An electronic system comprising:
    a first substrate including a first solder bump and a first gallium nitride based semiconductor device in electrical contact with the first solder bump;

a second substrate including a second solder bump and a second semiconductor device in electrical contact with the second solder bump; and an interposer comprising:
- a first surface;
- a second surface disposed opposite to the first surface;
- a polycrystalline ceramic core disposed between the first surface and the second surface, wherein the polycrystalline ceramic core comprises a material characterized by a coefficient of thermal expansion (CTE) that is substantially matched to CTE of gallium nitride;
- an adhesion layer encapsulating the polycrystalline ceramic core;
- a barrier layer encapsulating the adhesion layer, the barrier layer comprising an electrically non-conductive material; and
- one or more electrically conductive vias extending from the first surface to the second surface through the polycrystalline ceramic core, the adhesion layer, and the barrier layer, wherein each of the one or more electrically conductive vias includes a first bonding pad on the first surface and a second bonding pad on the second surface; and
- wherein the first solder bump is coupled to the first bonding pad on the first surface and the second solder bump is coupled to the second bonding pad on the second surface.

12. The electronic system of claim 11 wherein the first gallium nitride based semiconductor device is in electrical contact with the second semiconductor device through a subset of the one or more electrically conductive vias.

13. The electronic system of claim 11 wherein the first substrate is coupled to the interposer by the first solder bump.

14. The electronic system of claim 13 further comprising a dielectric coating coupled to the second substrate, wherein the dielectric coating is bonded to the barrier layer.

15. The electronic system of claim 14 further comprising a silicon layer coupled to the dielectric coating and the barrier layer of the interposer.

16. A method of manufacturing an electronic system comprising:
  forming an interposer for gallium nitride based semiconductor devices, the interposer including a first surface and a second surface, by:
    providing a polycrystalline ceramic core disposed between the first surface and the second surface, wherein the polycrystalline ceramic core comprises a material characterized by a coefficient of thermal expansion (CTE) that is substantially matched to CTE of gallium nitride;
    removing material from a portion of the polycrystalline ceramic core to form one or more channels extending from the first surface to the second surface;
    encapsulating the polycrystalline ceramic core in an adhesion layer;
    forming a conductive layer coupled to the adhesion layer; and
    encapsulating the adhesion layer and the conductive layer in a barrier layer, wherein the barrier layer comprises an electrically non-conductive material and covers side walls of the one or more channels;
  depositing a conductive material in the one or more channels to form one or more vias;
  selectively etching the conductive layer to form one or more lateral conductive interconnects; and
  encapsulating the conductive layer in a second adhesion layer;
  wherein the barrier layer encapsulates the second adhesion layer.

17. The method of claim 16 wherein the polycrystalline ceramic core comprises polycrystalline aluminum nitride.

18. A method of manufacturing an electronic system comprising:
  forming an interposer for gallium nitride based semiconductor devices, the interposer including a first surface and a second surface, by:
    providing a polycrystalline ceramic core disposed between the first surface and the second surface, wherein the polycrystalline ceramic core comprises a material characterized by a coefficient of thermal expansion (CTE) that is substantially matched to CTE of gallium nitride;
    removing material from a portion of the polycrystalline ceramic core to form one or more channels extending from the first surface to the second surface;
    encapsulating the polycrystalline ceramic core in an adhesion layer; and
    encapsulating the adhesion layer in a barrier layer, wherein the barrier layer comprises an electrically non-conductive material and covers side walls of the one or more channels:
  depositing a conductive material in the one or more channels to form one or more vias:
  providing a first substrate, the first substrate including a first solder bump and a first plurality of semiconductor devices in electrical contact with the first solder bump;
  providing a second substrate, the second substrate including a second solder bump and a second plurality of semiconductor devices in electrical contact with the second solder bump;
  forming a first electrical contact between a first via of the one or more vias and the first solder bump at the first surface of the interposer; and
  forming a second electrical contact between a second via of the one or more vias and the second solder bump at the second surface of the interposer.

19. The electronic system of claim 11 wherein the polycrystalline ceramic core comprises polycrystalline aluminum nitride.

20. The method of claim 18 wherein the barrier layer surrounds side walls of the one or more channels.

21. The method of claim 18 wherein the barrier layer comprises silicon nitride.

* * * * *